United States Patent
Hayashi

Patent Number: 6,090,480
Date of Patent: Jul. 18, 2000

[54] MAGNETORESISTIVE DEVICE

[75] Inventor: Kazuhiko Hayashi, Tokyo, Japan

[73] Assignee: NEC Corporation, Tokyo, Japan

[21] Appl. No.: 09/069,850

[22] Filed: Apr. 30, 1998

[30] Foreign Application Priority Data

Apr. 30, 1997 [JP] Japan .................................. 9-112220

[51] Int. Cl.⁷ ........................................................ G11B 5/66
[52] U.S. Cl. ...................... 428/332; 428/336; 428/692;
428/694 R; 428/694 T; 428/694 TS; 428/694 TM;
428/900; 360/113; 324/252
[58] Field of Search ............................... 428/692, 694 R,
428/694 T, 694 TS, 694 TM, 900, 332,
336; 360/113; 324/252

[56] References Cited

U.S. PATENT DOCUMENTS 5,549,978  8/1996  Iwesako .................................. 428/692

FOREIGN PATENT DOCUMENTS

| | | |
|---|---|---|
| 7-11354 | 1/1900 | Japan . |
| 7-136670 | 6/1900 | Japan . |
| 6-214837 | 9/1900 | Japan . |
| 6-269524 | 11/1900 | Japan . |
| 2-61572 | 3/1990 | Japan . |
| 4-358310 | 12/1992 | Japan . |
| 6-203340 | 7/1994 | Japan . |
| 7-202292 | 8/1995 | Japan . |
| 7-262529 | 10/1995 | Japan . |
| 8-127864 | 5/1996 | Japan . |
| 8-204253 | 8/1996 | Japan . |
| 9-50611 | 2/1997 | Japan . |
| 9-161243 | 6/1997 | Japan . |
| 9-186374 | 7/1997 | Japan . |
| 10-256621 | 9/1998 | Japan . |
| 10-284321 | 10/1998 | Japan . |

OTHER PUBLICATIONS

S. Oikawa, et al., "Physical Properties of Spin–Valve Materials—Dependence on Preparation Method, Materials, and Annealing Condition–", Sanyo Electric Co., Ltd., New Materials Research Center, Jan., 1997, pp. 21–27.

D. A. Thompson et al., "Thin Film Magnetoresistors in Memory, Storage, and Related Applications", *IEEE Transactions on Magnetics*, vol. MAG–11, No. 4, Jul. 1975, pp. 1039–1050.

*Primary Examiner*—Leszek Kiliman
*Attorney, Agent, or Firm*—Sughrue, Mion, Zinn, Macpeak & Seas, PLLC

[57] ABSTRACT

An under layer 101, a first free magnetic layer 102, a non-magnetic layer 104, a fixed magnetic layer 106 and an anti-ferromagnetic layer 107 are formed in the mentioned order on a substrate 100. The under layer 11 is a laminate layer 101 is a laminate layer constituted by two or more metal layers of different materials. The metal layers are formed by using a member or an alloy of two or more members of the metal group consisting of Ta, Hr, Zr, W, Cr, Ti, Mo, Pt, Ni, Ir, Cu, Ag, Co, Zn, Ru, Rh, Re, Au, Os, Pd, Nb and V.

14 Claims, 22 Drawing Sheets

FIG. 19

| | | | | | 1ST UNDER LAYER | | | | | |
|---|---|---|---|---|---|---|---|---|---|---|
| | | (a) Ta | (b) Hf | (c) Zr | (d) W | (e) Cr | (f) Ti | (g) Mo | (h) Pt | (i) Ni | (j) Ir |
| 2ND UNDER LAYER | (1)Ta | - - - | 0.5 630 6.8 | 0.6 750 7.2 | 0.7 640 6.5 | 1.2 520 6.3 | 0.8 670 6.4 | 0.4 620 6.9 | 0.6 540 7.0 | 0.7 530 4.8 | 0.9 560 6.5 |
| | (2)Hf | 0.6 680 6.3 | - - - | 0.7 790 6.4 | 0.8 650 6.3 | 0.6 520 6.1 | 0.5 670 6.8 | 0.4 620 6.3 | 0.7 540 6.5 | 1.0 530 5.8 | 1.5 560 6.2 |
| | (3)Zr | 0.8 710 6.7 | 0.6 660 6.8 | - - - | 0.4 610 8.2 | 0.4 620 5.9 | 0.3 640 5.5 | 0.8 650 5.7 | 1.0 540 5.2 | 1.2 590 5.8 | 0.8 580 5.4 |
| | (4)W | 0.3 580 3.7 | 0.5 490 3.9 | 0.6 560 4.0 | - - - | 0.4 520 4.2 | 0.7 600 4.4 | 1.0 630 4.7 | 0.9 570 4.9 | 1.0 550 4.4 | 0.7 540 5.1 |
| | (5)Cr | 0.7 470 3.9 | 0.8 480 3.5 | 1.2 510 3.6 | 0.6 470 4.1 | - - - | 0.9 520 4.2 | 0.8 510 4.3 | 0.6 490 4.1 | 0.4 420 4.0 | 1.2 480 3.3 |
| | (6)Ti | 1.0 550 5.5 | 1.1 570 5.8 | 0.8 520 5.7 | 0.7 530 4.6 | 0.6 590 4.8 | - - - | 0.3 620 5.1 | 1.3 570 4.8 | 0.9 630 4.5 | 0.7 590 5.5 |
| | (7)Mo | 0.8 470 3.5 | 0.6 590 4.1 | 0.4 630 3.9 | 0.5 750 4.7 | 0.7 640 4.6 | 0.9 520 4.1 | - - - | 1.3 670 4.4 | 0.9 540 4.5 | 0.3 530 4.5 |
| | (8)Pt | 1.1 680 3.6 | 0.7 690 3.7 | 0.8 630 3.5 | 0.6 750 3.7 | 0.5 640 3.6 | 0.6 520 3.8 | 0.7 670 3.6 | - - - | 0.9 620 4.4 | 0.6 530 4.3 |

FIG. 20

<table>
<tr><th rowspan="2">2ND UNDER LAYER</th><th colspan="10">1ST UNDER LAYER</th></tr>
<tr><th>(a) Ta</th><th>(b) Hf</th><th>(c) Zr</th><th>(d) W</th><th>(e) Cr</th><th>(f) Ti</th><th>(g) Mo</th><th>(h) Pt</th><th>(i) Ni</th><th>(j) Ir</th></tr>
<tr><td>(9) Ni</td><td>0.6<br>750<br>3.6</td><td>0.4<br>640<br>4.1</td><td>0.3<br>520<br>3.8</td><td>0.3<br>670<br>4.5</td><td>0.7<br>620<br>4.2</td><td>0.5<br>540<br>4.4</td><td>0.8<br>560<br>4.9</td><td>0.9<br>770<br>4.8</td><td>-<br>-<br>-</td><td>0.7<br>560<br>3.9</td></tr>
<tr><td>(10) Ir</td><td>0.9<br>630<br>3.8</td><td>0.7<br>750<br>4.1</td><td>0.7<br>640<br>4.9</td><td>0.8<br>520<br>4.8</td><td>0.9<br>670<br>4.2</td><td>1.2<br>620<br>4.4</td><td>0.9<br>540<br>4.9</td><td>0.3<br>530<br>5.0</td><td>0.4<br>770<br>4.7</td><td>-<br>-<br>-</td></tr>
<tr><td>(11) Cu</td><td>0.6<br>670<br>3.8</td><td>1.5<br>620<br>4.2</td><td>0.7<br>540<br>4.9</td><td>0.5<br>540<br>4.3</td><td>0.6<br>770<br>5.3</td><td>0.5<br>610<br>4.4</td><td>0.4<br>490<br>4.7</td><td>0.7<br>610<br>4.6</td><td>1.0<br>530<br>5.0</td><td>2.1<br>560<br>3.7</td></tr>
<tr><td>(12) Ag</td><td>2.1<br>520<br>3.7</td><td>0.7<br>670<br>3.2</td><td>0.8<br>650<br>3.8</td><td>0.6<br>590<br>3.6</td><td>0.5<br>530<br>3.9</td><td>0.6<br>620<br>3.5</td><td>0.7<br>520<br>3.8</td><td>0.7<br>570<br>4.1</td><td>0.9<br>510<br>4.2</td><td>0.6<br>530<br>4.3</td></tr>
<tr><td>(13) Co</td><td>0.7<br>370<br>3.7</td><td>0.6<br>360<br>4.1</td><td>0.4<br>410<br>3.5</td><td>0.3<br>350<br>3.9</td><td>1.2<br>340<br>4.2</td><td>0.9<br>270<br>4.1</td><td>0.5<br>370<br>3.3</td><td>0.7<br>390<br>3.7</td><td>1.8<br>430<br>4.5</td><td>1.5<br>460<br>4.1</td></tr>
<tr><td>(14) Zn</td><td>0.7<br>410<br>3.3</td><td>1.1<br>430<br>3.9</td><td>0.9<br>450<br>3.6</td><td>0.7<br>440<br>4.1</td><td>0.6<br>520<br>4.0</td><td>2.7<br>470<br>3.7</td><td>1.8<br>420<br>3.4</td><td>0.9<br>440<br>3.5</td><td>1.6<br>430<br>3.3</td><td>1.3<br>460<br>3.2</td></tr>
<tr><td>(15) Ru</td><td>1.7<br>560<br>4.1</td><td>1.3<br>570<br>4.2</td><td>0.9<br>520<br>4.1</td><td>0.5<br>490<br>4.0</td><td>1.7<br>510<br>3.8</td><td>2.8<br>470<br>3.5</td><td>2.3<br>420<br>3.4</td><td>3.0<br>530<br>3.3</td><td>0.8<br>560<br>4.2</td><td>1.1<br>460<br>3.7</td></tr>
</table>

FIG. 21

| 2ND UNDER LAYER | 1ST UNDER LAYER | | | | | | | | | |
|---|---|---|---|---|---|---|---|---|---|---|
| | (a) Ta | (b) Hf | (c) Zr | (d) W | (e) Cr | (f) Ti | (g) Mo | (h) Pt | (i) Ni | (j) Ir |
| (16)Rh | 0.6 490 4.5 | 0.8 470 4.6 | 0.6 450 4.2 | 0.4 460 4.7 | 0.9 420 4.8 | 0.4 480 4.9 | 0.3 490 4.2 | 0.5 460 3.9 | 0.6 420 3.7 | 1.2 490 4.0 |
| (17)Re | 1.0 150 3.1 | 1.5 190 2.9 | 1.6 150 3.2 | 1.4 170 3.4 | 1.9 200 3.3 | 2.1 210 2.9 | 2.4 120 3.0 | 2.7 170 3.7 | 2.9 190 3.5 | 1.2 260 2.9 |
| (18)Au | 0.9 570 3.9 | 0.4 530 3.5 | 0.6 470 3.6 | 0.8 460 3.7 | 0.7 490 4.1 | 0.4 520 3.9 | 0.3 590 3.5 | 0.5 440 3.4 | 0.9 560 3.8 | 1.2 510 3.7 |
| (19)Os | 3.4 470 3.9 | 3.5 450 3.5 | 5.0 460 3.4 | 5.8 480 3.6 | 5.6 490 3.7 | 6.0 450 3.5 | 2.8 580 3.7 | 6.2 560 3.5 | 4.2 510 3.7 | 4.7 550 3.3 |
| (20)Pd | 0.9 450 4.5 | 0.5 460 5.0 | 0.7 480 4.9 | 0.8 520 4.2 | 0.4 550 4.3 | 0.9 540 4.5 | 0.4 490 3.9 | 0.5 440 4.6 | 0.6 500 4.7 | 0.9 450 5.1 |
| (21)Nb | 0.6 520 3.9 | 0.4 590 3.6 | 0.5 570 3.7 | 0.4 610 3.5 | 1.0 560 3.6 | 1.2 470 3.5 | 0.5 570 3.4 | 0.7 610 3.8 | 0.8 550 3.6 | 0.7 560 3.7 |
| (22)V | 0.7 590 4.5 | 0.4 610 4.8 | 0.8 550 4.7 | 0.9 570 4.6 | 1.3 610 4.9 | 0.9 620 5.0 | 0.6 590 4.7 | 0.7 550 4.8 | 0.8 570 4.1 | 1.0 600 4.8 |

FIG. 22

| 2ND UNDER LAYER | 1ST UNDER LAYER | | | | | | | | | | | |
|---|---|---|---|---|---|---|---|---|---|---|---|---|
| | (k) Cu | (l) Ag | (m) Co | (n) Zn | (o) Ru | (p) Rh | (q) Re | (r) Au | (s) Os | (t) Pd | (u) Nb | (v) V |
| (1) Ta | 0.4 / 470 / 7.8 | 0.6 / 650 / 7.5 | 0.9 / 550 / 7.2 | 0.8 / 670 / 7.1 | 0.7 / 430 / 7.9 | 0.9 / 590 / 7.2 | 0.4 / 280 / 7.5 | 0.5 / 450 / 7.6 | 0.6 / 520 / 7.4 | 0.8 / 530 / 7.6 | 0.7 / 470 / 7.2 | 0.4 / 560 / 7.6 |
| (2) Hf | 0.5 / 470 / 7.1 | 0.6 / 460 / 7.2 | 0.8 / 420 / 7.6 | 0.7 / 490 / 8.1 | 0.8 / 510 / 6.8 | 0.9 / 560 / 6.9 | 0.5 / 370 / 7.2 | 0.7 / 490 / 6.9 | 0.5 / 480 / 7.1 | 0.7 / 510 / 7.0 | 0.5 / 520 / 7.6 | 0.3 / 490 / 7.1 |
| (3) Zr | 0.7 / 600 / 7.8 | 0.6 / 540 / 7.6 | 0.6 / 510 / 7.9 | 0.9 / 410 / 7.4 | 0.7 / 610 / 7.2 | 0.5 / 520 / 7.1 | 0.3 / 270 / 7.6 | 0.5 / 560 / 6.8 | 0.7 / 480 / 7.2 | 0.8 / 510 / 7.9 | 0.6 / 590 / 6.6 | 0.6 / 400 / 7.0 |
| (4) W | 0.4 / 560 / 6.9 | 0.9 / 570 / 6.8 | 0.8 / 520 / 6.2 | 0.8 / 560 / 6.4 | 0.9 / 580 / 6.8 | 0.7 / 510 / 5.9 | 0.5 / 210 / 6.0 | 0.7 / 550 / 6.5 | 0.8 / 610 / 5.8 | 0.6 / 430 / 6.0 | 0.4 / 540 / 6.7 | 0.6 / 500 / 6.5 |
| (5) Cr | 0.6 / 470 / 4.2 | 0.7 / 650 / 4.5 | 0.8 / 550 / 5.0 | 0.6 / 670 / 5.1 | 0.7 / 430 / 4.6 | 0.6 / 590 / 4.9 | 0.5 / 280 / 4.7 | 0.7 / 450 / 3.8 | 0.6 / 520 / 4.5 | 0.8 / 530 / 4.3 | 0.6 / 470 / 4.1 | 0.7 / 560 / 4.0 |
| (6) Ti | 0.4 / 510 / 5.0 | 0.6 / 600 / 5.1 | 0.7 / 540 / 5.4 | 0.6 / 510 / 4.8 | 0.8 / 410 / 5.6 | 0.4 / 610 / 5.7 | 0.6 / 520 / 5.2 | 0.7 / 270 / 4.6 | 0.6 / 560 / 4.7 | 0.8 / 480 / 5.3 | 0.4 / 510 / 4.5 | 0.6 / 590 / 5.1 |
| (7) Mo | 1.1 / 510 / 4.8 | 1.2 / 610 / 4.7 | 1.6 / 540 / 4.7 | 1.2 / 590 / 4.8 | 1.3 / 470 / 5.0 | 1.5 / 490 / 5.1 | 2.0 / 560 / 5.0 | 2.4 / 550 / 4.8 | 1.6 / 510 / 4.8 | 0.9 / 490 / 4.7 | 1.5 / 530 / 4.6 | 1.7 / 480 / 4.5 |
| (8) Pt | 0.6 / 600 / 3.8 | 0.7 / 560 / 3.7 | 0.8 / 540 / 3.6 | 0.9 / 570 / 3.4 | 0.5 / 580 / 3.5 | 0.9 / 620 / 3.1 | 0.5 / 590 / 3.5 | 0.7 / 550 / 3.4 | 0.8 / 540 / 3.6 | 0.9 / 560 / 3.7 | 0.6 / 520 / 3.8 | 0.5 / 510 / 3.9 |

FIG. 23

| | | | | | | | 1ST UNDER LAYER | | | | | | | |
|---|---|---|---|---|---|---|---|---|---|---|---|---|---|---|
| 2ND UNDER LAYER | | (k) Cu | (l) Ag | (m) Co | (n) Zn | (o) Ru | (p) Rh | (q) Re | (r) Au | (s) Os | (t) Pd | (u) Nb | (v) V |
| | (9) Ni | 0.3<br>450<br>2.9 | 0.5<br>460<br>2.8 | 0.6<br>430<br>3.1 | 0.7<br>410<br>3.5 | 1.2<br>500<br>3.6 | 0.8<br>470<br>3.7 | 0.4<br>430<br>3.5 | 0.6<br>450<br>3.8 | 0.7<br>490<br>3.9 | 0.9<br>510<br>3.1 | 0.4<br>470<br>3.2 | 0.5<br>450<br>3.5 |
| | (10) Zr | 0.5<br>370<br>4.5 | 0.6<br>390<br>4.2 | 0.7<br>420<br>4.7 | 0.8<br>360<br>4.6 | 0.3<br>450<br>4.3 | 0.7<br>460<br>4.1 | 0.5<br>420<br>4.1 | 0.8<br>330<br>4.0 | 0.6<br>350<br>3.8 | 0.4<br>360<br>4.5 | 0.3<br>450<br>4.2 | 0.6<br>390<br>4.3 |
| | (11) Cu | -<br>-<br>- | 0.7<br>540<br>4.8 | 0.8<br>670<br>4.9 | 0.9<br>620<br>5.1 | 0.5<br>540<br>5.0 | 0.4<br>540<br>5.8 | 0.6<br>770<br>5.2 | 0.7<br>610<br>5.1 | 0.6<br>490<br>4.8 | 0.3<br>610<br>4.7 | 0.5<br>530<br>5.0 | 0.6<br>560<br>5.1 |
| | (12) Ag | 0.7<br>460<br>3.8 | -<br>-<br>- | 0.8<br>580<br>3.5 | 0.7<br>570<br>3.6 | 0.6<br>520<br>3.4 | 0.7<br>490<br>3.1 | 0.5<br>510<br>3.5 | 0.7<br>470<br>3.8 | 0.5<br>420<br>3.8 | 0.4<br>530<br>3.9 | 0.6<br>560<br>3.2 | 0.7<br>460<br>3.1 |
| | (13) Ti | 0.8<br>470<br>3.5 | 0.7<br>570<br>3.6 | -<br>-<br>- | 0.6<br>610<br>3.8 | 0.6<br>550<br>3.2 | 0.7<br>570<br>3.1 | 0.5<br>610<br>3.5 | 0.6<br>620<br>3.7 | 0.4<br>590<br>3.0 | 0.8<br>550<br>3.5 | 0.6<br>570<br>3.7 | 0.7<br>600<br>3.2 |
| | (14) Mo | 0.7<br>520<br>3.2 | 0.6<br>570<br>3.5 | 0.8<br>560<br>3.4 | -<br>-<br>- | 0.4<br>520<br>3.8 | 0.7<br>490<br>3.5 | 0.6<br>510<br>3.0 | 0.7<br>470<br>3.5 | 0.8<br>420<br>3.4 | 0.4<br>530<br>3.7 | 0.6<br>560<br>3.5 | 0.7<br>460<br>3.5 |
| | (15) Pt | 0.6<br>470<br>4.2 | 0.7<br>450<br>4.3 | 0.5<br>460<br>3.9 | 0.8<br>480<br>4.2 | -<br>-<br>- | 0.7<br>450<br>3.9 | 0.5<br>580<br>3.8 | 0.5<br>560<br>4.2 | 0.4<br>510<br>4.1 | 0.8<br>550<br>4.5 | 0.6<br>490<br>4.2 | 0.7<br>510<br>3.9 |

FIG. 24

|  | 1ST UNDER LAYER | | | | | | | | | | | |
|---|---|---|---|---|---|---|---|---|---|---|---|---|
|  | (k) Cu | (l) Ag | (m) Co | (n) Zn | (o) Ru | (p) Rh | (q) Re | (r) Au | (s) Os | (t) Pd | (u) Nb | (v) V |
| (16)Rh | 0.8 / 500 / 4.2 | 0.9 / 460 / 4.1 | 1.2 / 450 / 4.2 | 1.1 / 460 / 4.5 | 1.0 / 480 / 4.0 | - / - / - | 0.9 / 550 / 4.1 | 0.8 / 540 / 4.6 | 0.7 / 490 / 4.2 | 0.6 / 440 / 4.3 | 0.7 / 500 / 4.2 | 0.5 / 450 / 4.0 |
| (17)Re | 2.7 / 420 / 2.9 | 6.5 / 480 / 3.0 | 5.5 / 570 / 3.2 | 4.5 / 530 / 3.2 | 3.7 / 470 / 3.1 | 6.3 / 460 / 2.9 | - / - / - | 3.3 / 520 / 3.0 | 3.7 / 590 / 3.4 | 5.0 / 440 / 3.5 | 6.3 / 560 / 3.7 | 5.7 / 510 / 3.2 |
| (18)Au | 0.7 / 470 / 3.5 | 0.4 / 480 / 3.6 | 0.6 / 450 / 3.2 | 0.5 / 460 / 3.7 | 0.4 / 480 / 3.2 | 0.9 / 520 / 3.5 | 0.4 / 550 / 3.8 | - / - / - | 0.7 / 490 / 4.1 | 0.5 / 440 / 3.2 | 0.7 / 500 / 3.5 | 0.3 / 450 / 3.7 |
| (19)Os | 1.7 / 460 / 4.5 | 1.2 / 510 / 4.2 | 1.6 / 410 / 4.3 | 2.0 / 430 / 4.1 | 2.4 / 450 / 4.0 | 2.6 / 440 / 4.5 | 2.7 / 420 / 4.2 | 2.1 / 460 / 4.5 | - / - / - | 1.9 / 420 / 4.1 | 1.8 / 450 / 4.2 | 1.5 / 460 / 4.1 |
| (20)Pd | 0.9 / 510 / 3.9 | 1.2 / 460 / 3.8 | 1.3 / 430 / 3.6 | 1.7 / 470 / 4.1 | 1.2 / 510 / 4.2 | 0.8 / 560 / 3.8 | 0.6 / 370 / 4.2 | 0.8 / 490 / 3.2 | 0.9 / 480 / 4.5 | - / - / - | 0.8 / 520 / 3.9 | 0.6 / 490 / 3.5 |
| (21)No | 0.8 / 480 / 6.2 | 0.7 / 470 / 6.5 | 0.9 / 590 / 6.8 | 1.1 / 610 / 6.7 | 1.0 / 550 / 6.4 | 0.8 / 570 / 6.2 | 0.7 / 610 / 6.3 | 0.8 / 620 / 6.5 | 0.9 / 590 / 6.1 | 1.4 / 550 / 5.8 | - / - / - | 1.1 / 600 / 6.0 |
| (22)V | 0.4 / 460 / 5.9 | 0.6 / 490 / 5.8 | 0.7 / 450 / 6.5 | 0.3 / 460 / 6.3 | 0.8 / 480 / 5.8 | 0.9 / 520 / 6.5 | 0.5 / 550 / 5.9 | 0.7 / 540 / 6.7 | 0.6 / 490 / 5.9 | 0.7 / 440 / 5.8 | 0.6 / 500 / 6.2 | - / - / - |

2ND UNDER LAYER

FIG.25

| ANTI-FERROMAGNETIC LAYER(at%) | FERROMAGNETIC LAYER THICKNESS(nm) | HEAT TREATING CONDITION | Hex (Oe) | MR (%) |
|---|---|---|---|---|
| NiMn | 30 | 270°C 5Hrs | 680 | 6.3 |
| PtMn | 30 | 250°C 5Hrs | 630 | 7.8 |
| IrMn | 50 | 230°C 5Hrs | 580 | 6.7 |
| FeMn | 8 | NONE | 470 | 8.5 |
| PtPdMn | 30 | 230°C 5Hrs | 480 | 7.6 |
| ReMn | 30 | 220°C 5Hrs | 380 | 8.3 |
| CrMn | 30 | NONE | 420 | 8.6 |
| Ni-OXIDE | 30 | NONE | 450 | 11.5 |
| IRON-OXIDE | 30 | NONE | 400 | 10.6 |
| MIXTURE OF Ni-OXIDE AND Co-OCIDE | 30 | NONE | 380 | 11.8 |
| MIXTURE OF Ni-OXIDE AND Fe-OCIDE | 30 | NONE | 410 | 10.0 |
| TWO LAYERS OF Ni-OXIDE/Co-OXIDE | 30/1 | NONE | 450 | 12.0 |
| TWO LAYERS OF Ni-OXIDE/Fe-OXIDE | 30/3 | NONE | 440 | 10.4 |

FIG. 26

| LAYER | Hex(Oe) | MR RAITO(%) |
|---|---|---|
| FIG.5 | 680 | 6.3 |
| FIG.6 | 650 | 8.2 |
| FIG.7 | 660 | 3.5 |
| FIG.8 | 720 | 5.2 |
| FIG.9 | 380 | 6.7 |
| FIG.10 | 390 | 9.1 |
| FIG.11 | 420 | 4.2 |
| FIG.12 | 460 | 6.2 |

FIG. 27

| 1ST FREE MAGNETIC LAYER | RESISTIVITY CHANGE(%) | RESISTIVITY RATIO($\mu\Omega$cm) | RESISTIVITY RATIO CHANGE($\mu\Omega$cm) |
|---|---|---|---|
| $Co_{92}Zr_8$ | 6.5 | 50 | 3.2 |
| $Co_{83}Zr_{17}$ | 5.0 | 62 | 3.1 |
| $Co_{92}Hf_8$ | 6.2 | 52 | 3.2 |
| $Co_{83}Ta_{17}$ | 5.3 | 64 | 3.4 |
| $Co_{93}Ta_7$ | 6.4 | 51 | 3.3 |
| $Co_{92}Zr_3Nb_5$ | 6.7 | 63 | 4.2 |
| $Co_{92}Hf_5Pd_3$ | 6.5 | 63 | 4.1 |
| $Co_{88}Ta_8Hf_4$ | 5.8 | 59 | 3.4 |
| $Co_{87}Nb_9Hf_4$ | 5.5 | 57 | 3.1 |
| $Co_{87}Ta_9Zr_4$ | 5.4 | 59 | 3.2 |
| $Co_{86}Nb_9Zr_5$ | 5.8 | 61 | 3.5 |
| $Co_{92}Zr_4Ta_4$ | 6.1 | 58 | 3.5 |
| $Co_{79}Zr_{10}Mo_9Ni_2$ | 5.8 | 66 | 3.8 |
| $Co_{82.5}Zr_{5.5}Ta_4Nb_8$ | 5.5 | 62 | 3.4 |
| $Co_{74}Zr_6Mo_{20}$ | 5.8 | 70 | 4.1 |
| $Co_{72}Fe_8B_{20}$ | 4.9 | 72 | 3.5 |

MAGNETORESISTIVE DEVICE

BACKGROUND OF THE INVENTION

The present invention relates to magnetoresistive devices for reading out data recorded on magnetic memory media, and also to magnetoresistive sensors, magnetoresistive sensor systems and magnetic memory systems using the same.

Magnetic reading transducers which are called magnetoresistive (MR) sensors or MR heads are well known in the art. These magnetic reading transducers feature that data can be read out from a magnetic memory medium surface at high linear density. The MR sensors detect magnetic field signal via a resistance change, which is a function of the intensity and direction of a magnetic flux sensed by a reading device. Such prior art MR sensors are operable on the basis of anisotropic magnetoresistive (AMR) effect, i.e., changes in a component of the resistance of the reading device in proportion to the cosine of the angle between the magnetizing direction and the direction of a sense current through the device. The AMR effect is described in greater details in D. A. Thompson, "Memory, Storage and Related Applications", IEEE Trans. on Mag. MAG-11, p. 1039, 1975. In many magnetic head utilizing the AMR effect, a vertical bias is applied in order to suppress the Barkhousen noise. In some applications, anti-ferromagnetic materials such as FeMn, NiMn and nickel oxide are used as vertical bias application material.

Up to date, a more pronounced magnetoresistive effect has been reported, in which changes in the resistance of a laminate magnetic sensor are attributable to the spin-dependent transfer of conductive electrons between two magnetic layers via an intervening non-magnetic layer and also to accompanying spin-dependent dispersions of conductive electrons in the interfaces between the adjacent layers. This magnetoresistive effect is also called "giant magnetoresistive effect", "spin valve effect" and so forth. Such MR sensors are made of adequate materials, and they have improved sensitivity and provide great resistance changes compared to those observed with sensors utilizing the AMR effect. In this type of MR sensor, the plane resistance between a pair of ferromagnetic layers spaced apart by a non-magnetic layer is changed in proportion to the cosine of the angle between the magnetizing directions of the two layers.

Japanese Laid-Open Patent Publication No. 2-61572 discloses a magnetic laminate structure providing great MR changes which are attributable to anti-parallel array of magnetization in a magnetic layer. The publication mentions ferromagnetic transition metals and alloys thereof as materials capable of being used for the laminate structure. The publication further discloses a structure, which has an anti-ferromagnetic layer provided for at least one of two ferromagnetic layers spaced apart by an intervening layer, and also teaches that FeMn is adequately used for the anti-ferromagnetic layer.

Japanese Laid-Open Patent Publication No. 4-358310 discloses an MR sensor, which has two ferromagnetic thin-film layers partitioned by a non-magnetic metal thin-film layer. In this MR sensor, when the applied magnetic field is zero, the magnetizing directions of the two ferromagnetic thin-film layers are perpendicular to each other, and the resistance between the two non-coupled ferromagnetic layers is changed in proportion to the cosine of the angle between the magnetizing directions of the two layers and independent of the direction of current passing through the sensor.

Japanese Laid-Open Patent Publication No. 6-203340 discloses an MR sensor, which again has two ferromagnetic thin-film layers spaced apart by a non-magnetic metal thin film. This MR sensor is based on the above effect that when the external applied magnetic field is zero, the magnetizing direction of an adjacent anti-ferromagnetic layer is perpendicular to the other ferromagnetic layer.

Japanese Laid-Open Patent Publication No. 7-262529 discloses a magnetoresistive device, which is a spin valve having a structure including a first magnetic layer, a non-magnetic layer, a second magnetic layer and an anti-ferromagnetic layer, these layers being formed in the mentioned order. Particularly, the first and second magnetic layers are formed by using CoZrNb, CoZrMo, FeSiAl, FeSi or NiFe with or without addition of Cr, Mn, Pt, Ni, Cu, Ag, Al, Ti, Fe, Co or Zn.

Japanese Laid-Open Patent Publication No. 7-202292 discloses a magnetoresistive film, which includes a plurality of magnetic thin films laminated on a substrate via a nonmagnetic film. An anti-ferromagnetic thin film is provided adjacent one of two soft magnetic thin films adjacent to each other via a non-magnetic thin film. In this magnetoresistive film, the bias magnetic field Hr applied to the anti-ferromagnetic film and the coercive force Hc2 of the other soft magnetic thin film are related to be Hc2<Hr. The anti-ferromagnetic material is a member of an alloy of two or more members of the group consisting of NiO, CoO, FeO, $Fe_2O_3$, MnO and Cr.

Japanese Patent Applications No. 6-214837 and 6-269524 disclose the above magnetoresistive film, wherein the anti-ferromagnetic material comprises at least two superlattice members selected from the group consisting of NiO, $Ni_xCo_{1-x}O$ and CoO.

Japanese Patent Application No. 7-11354 discloses the above magnetoresistive film, wherein the anti-ferromagnetic material comprises at least two super-lattice members selected from the group consisting of NiO, $Ni_xCo_{1-x}O$ (X=0.1 to 0.9) and CoO, the atomic number ratio of Ni to Co in the super-lattices being 1.0 or above.

Japanese Patent Application No. 7-136670 discloses the above magnetroresistance effect film, wherein the anti-ferromagnetic material is provided as a two-layer film obtained by laminating CoO of 10 to 40 angstroms on NiO.

The Japanese Laid-Open Patent Publication No. 7-262529 discloses examples of the magnetoresistive device, in which the under layer is formed as a $Si_3N_4$ (50 nm thick)/Hf (5 nm thick)/Ta (5 nm thick).

In the prior art magnetoresistive device having the basic structure by laminating an under layer, a free magnetic layer, a non-magnetic layer, a fixed magnetic layer and an anti-ferromagnetic layer in the mentioned order, the resistance change rate is greatly reduced by annealing at 200° C. or above. Many magnetoresistive devices of this type require a heat treatment at 200° C. or above in order to obtain an exchange coupled field provided form the anti-ferromagnetic layer to the fixed magnetic layer. Such a heat treatment, however, results in deterioration of the interfaces between the free magnetic and non-magnetic layers and between the non-magnetic and fixed magnetic layers, thus reducing the magnetoresistive change rate.

Even where an anti-ferromagnetic magnetic layer of the type not requiring any heat treatment is used, a process of hardening the resist of a write head section is indispensable when actually manufacturing a recording/reproducing head. This process requires a heat treatment at a temperature of 200° C. or above. In the stage when the actual head has been obtained, therefore, the resistance change rate of the magnetoresistive film has been greatly reduced, thus posing a problem of failure of obtaining a design output.

SUMMARY OF THE INVENTION

An object of the present invention is to provide a magnetoresistive device, which ensures heat resistance at temperatures of 200° C. and above while securing sufficiently high resistance change rate, sufficiently low exchange coupled field provided from the anti-ferromagnetic layer to the fixed magnetic layer and sufficiently low coercive force of the free magnetic layer, as well as a magnetoresistive sensor, a magnetoresistive sensor system and a magnetic memory system using the same magnetoresistive device.

According to an aspect of the present invention, there is provided a magnetoresistive device comprising a magnetic layer, a non-magnetic layer, a magnetic layer and an anti-ferromagnetic layer, or an anti-ferromagnetic layer, a magnetic layer, a non-magnetic layer and a magnetic layer, these layers being formed in the mentioned order on an under layer formed on a substrate, wherein the under layer is a laminate layer constituted by two or more metal layers of different materials.

The metal layers are formed by using a member or an alloy of two or more members of the metal group consisting of Ta, Hf, Zr, W, Cr, Ti, Mo, Pt, Ni, Ir, Cu, Ag, Co, Zn, Ru, Rh, Re, Au, Os, Pd, Nb and V.

The metal layers are formed by using a member of the group consisting of Ta, Hf, Zr, W, Cr, Ti, Mo, Pt, Ni, Ir, Cu, Ag, Co, Zn, Ru, Rh, Re, Au, Os, Pd, Nb and V.

According to another aspect of the present invention, there is provided a magnetoresistive sensor of shield type comprising lower shield layer, a lower gap layer, a magnetoresistance effect device, these layers and the device being laminatedly formed in the mentioned order on a substrate, the lower shield layer being patterned, the magnetoresistive device being patterned, a vertical bias layer, a lower electrode layer, these layers being laminatedly formed in the mentioned order such as to be continuous to the edges of the patterned magnetoresistive device, an upper gap layer, and an upper shield layer, these layers being laminatedly formed in the mentioned order on the lower electrode layer and the magnetoresistive device, wherein the magnetoresistive device is as set forth in the foregoing.

According to other aspect of the present invention, there is provided a magnetoresistive device of said type comprising a lower shield layer, a lower gap layer, a magnetoresistive device, these layers and the device being laminatedly formed on a substrate, the lower shield layer being patterned, the magnetoresistive device being patterned, a vertical bias layer, a lower electrode layer, these layers being laminatedly formed in the mentioned order such as to be partly overlap the patterned magnetoresistive device, an upper gap layer, and an upper shield layer, these layers being laminatedly formed on the lower gap layer and the lower shield layer.

According to still other aspect of the present invention, there is provided a magnetoresistive sensor system comprising the magneto-resistance effect sensor according to one of claims 4 and 5, comprises means for generating a current passing through the magnetoresistive sensor, means for detecting a resistance change rate as a function of a magnetic field detected by the magnetoresistive sensor.

According to other aspect of the present invention, there is provided a magnetic memory system comprising a magnetic memory medium having a plurality of data recording tracks, a magnetic recording system for storing data on the magnetic memory medium, the magnetoresistive sensor system, and actuator means coupled to the magnetoresistive sensor system and also to the magnetic recording system and capable of shifting the magnetoresistive sensor system and the magnetic recording system to a position corresponding to a selected track on the magnetic recording medium.

In summary, the magnetoresistive device according to the present invention comprises a magnetic layer, a non-magnetic layer, a magnetic layer and an anti-ferromagnetic layer, or an anti-ferromagnetic layer, a magnetic layer, a non-magnetic layer and a magnetic layer, these layers being formed in the mentioned order on an under layer formed on a substrate. The under layer is a laminate layer constituted by two metal layers of different materials. As an example, these metal layers are formed by using a member or an alloy of two or more members of the metal group consisting of Ta, Hf, Zr, W, Cr, Ti, Mo, Pt, Ni, Ir, Cu, Ag, Co, Zn, Ru, Rh, Re, Au, Os, Pd, Nb and V.

When two layers of metals having different lattice constants are laminated to thicknesses of the order of several nm, the metal layer that is formed later is in a state that it is difficulty crystallized due to lattice mismatching. Therefore, this metal layer becomes amorphous when an adequate thickness is reached. At this time, the free magnetic layer or anti-ferromagnetic layer in the laminate formed on the under layer are or is crystallized or become or becomes amorphous with such structure and crystal orientation as to minimize the interface energy with respect to the under layer, the surface energy and the energy within them or it. According to the present invention, the under layer is not crystalline, so that the interface energy can be substantially ignored. Thus, the free magnetic layers or the anti-ferromagnetic layer can freely grow in the intended crystal state and direction.

As powerful candidates of the material constituting a spin valve for the free magnetic layers are NiFe, NiFeCo, CoFe and amorphous materials (for instance of CoFeB and CoZr types), and as those for the anti-ferromagnetic layer are NiMn, IrMn, PdMn, PtMn, RhMn and FeMn. As the steadiest structure of these materials from the energy standpoint, NiFe, NiFeCo, CoFe, etc. are in their fcc structure with the densest surface perpendicular to the film surface, the amorphous materials are in their amorphous state, NiMn, IrMn, PdMn, PtMn and RhMn are in their fcc structure with the densest surface perpendicular to the film surface, and FeMn is in its fcc structure with the densest surface perpendicular to the film surface. In these structures, the coercive force of the free magnetic layers is minimum, and the exchange coupled field provided from the anti-ferromagnetic layer to the fixed magnetic layer and the magnetoresistive change are maximum. These properties of the free magnetic layers and the anti-ferromagnetic layer are most effective for the usefulness of the spin valve head. Since these structures are steadiest from the energy standpoint, they are less liable to motion of atoms to and from other layers and hence dispersion of atoms even at high temperatures. Thus, these structures permit prevention of deterioration of the interfaces due to the heat treatment.

It is thus possible to obtain satisfactory output characteristics, output waveform and bit error rate and also excellent thermal reliability, when the invention is applied to spin valve films and spin valve devices as well as recording/reproducing heads, recording/reproducing systems and hard disc apparatuses employing such films and devices.

Other objects and features will be clarified from the following description with reference to attached drawings.

BRIEF DESCRIPTION OF THE DRAWINGS

FIGS. 19 to 24 show the coercive force of the free magnetic layers, the exchange coupled field (Oe) applied from the anti-ferromagnetic layer to the fixed magnetic layer, and the magnetoresistive ratio (%), for the present invention;

FIG. 25 shows the Hex and the MR ratio obtained with various anti-ferromagnetic layers for the present invention; and FIGS. 26 and 27 show the properties of the individual structures for the present invention.

PREFERRED EMBODIMENTS OF THE INVENTION

Preferred embodiments of the present invention will now be described with reference to the drawings.

Figure 1:
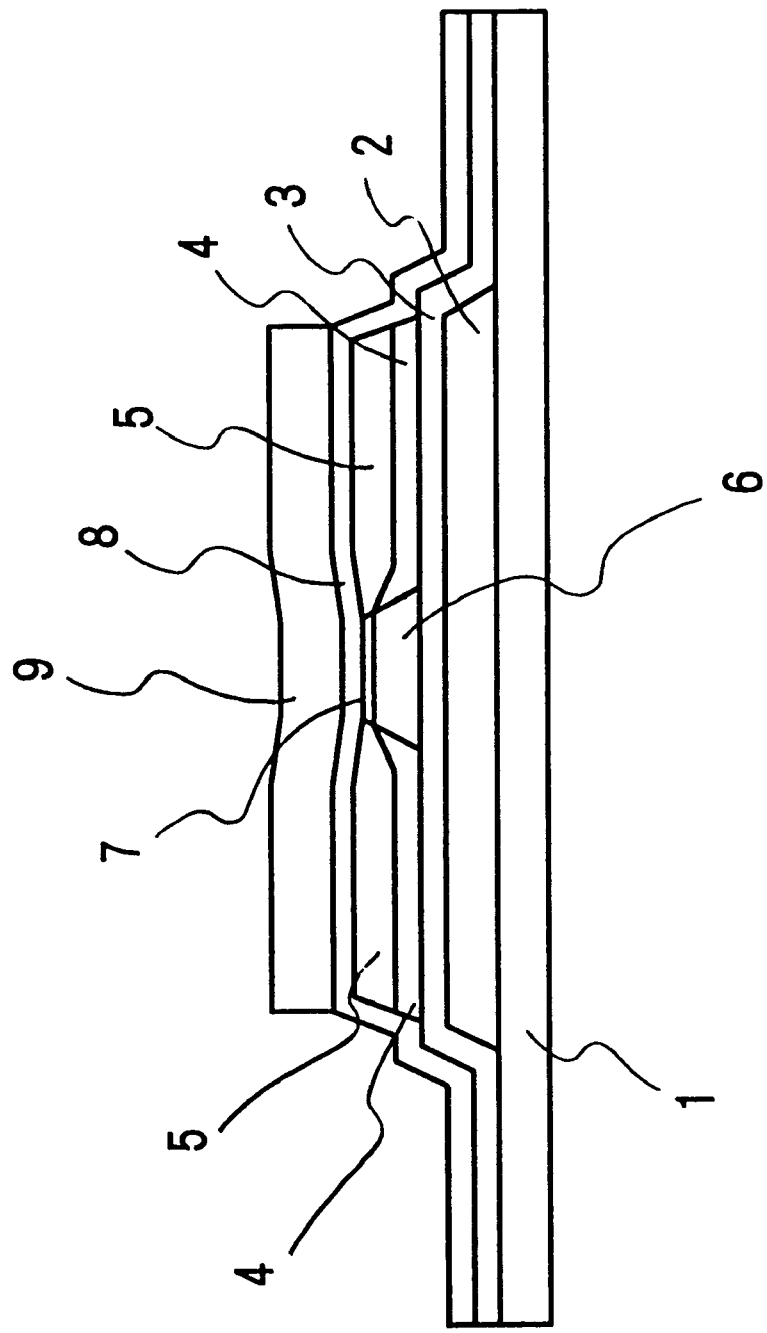
FIGS. 1 and 2 show structures of magnetoresistive sensors of shield type according to the present invention.
Figure 2:
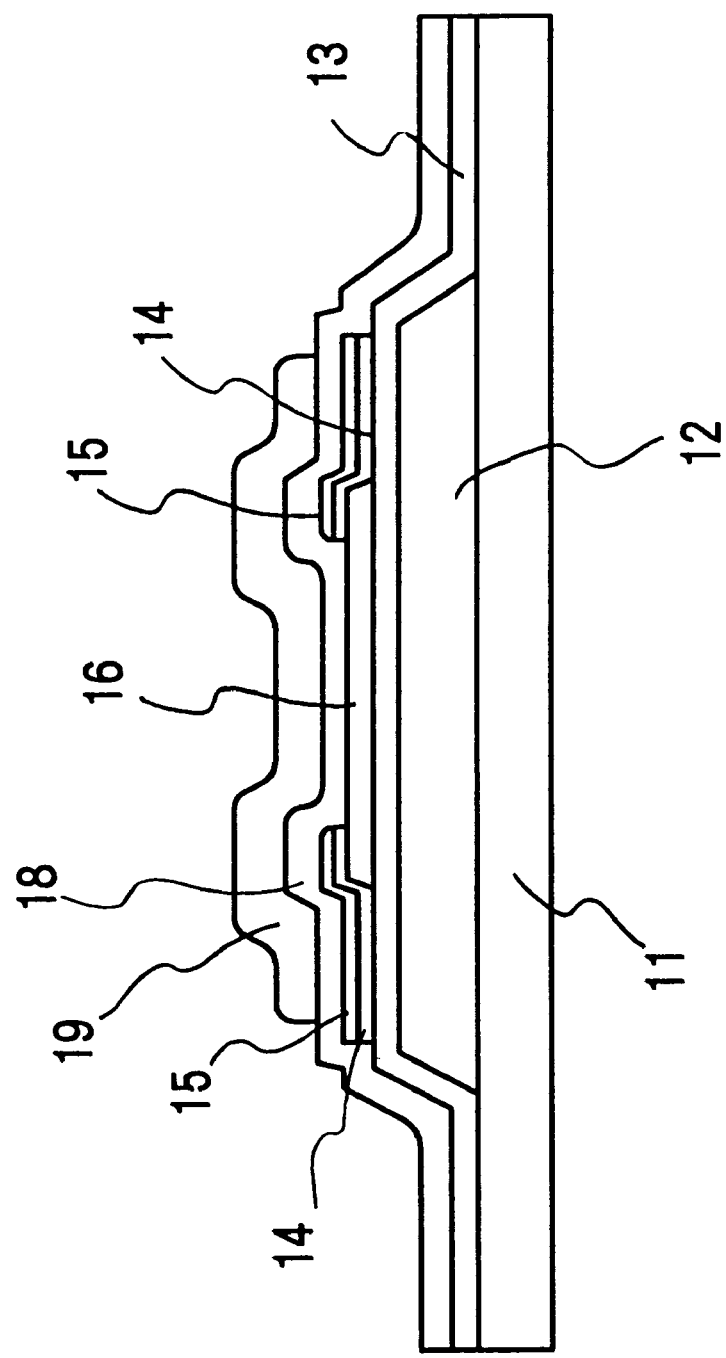

FIGS. 1 and 2 show structures of magnetoresistive sensors of shield type according to the present invention.

In the manufacture of the magnetoresistive sensor shown in FIG. 1, a lower shield layer 2, a lower gap layer 3 and a magnetoresistive device 6 are laminated on a substrate 1. A gap regulation insulating layer 7 may be laminated on the magnetoresistive device 6. The lower shield layer 2 is often patterned to an appropriate size by a photo-resist (PR) process. The magnetoresistive device 6 is patterned to an appropriate size by the PR process. A vertical bias layer 4 and a lower electrode layer 5 are then laminated on the lower gap layer 3 such that they are contiguous to the edges of the magnetoresistive device 6. An upper gap layer 8 and an upper shield layer 9 are then laminated thereon.

In the manufacture of the magnetoresistive sensor shown in FIG. 2, a lower shield layer 12, a lower gap layer 13 and a magneto-resistance effect device 16 are laminated on a substrate 11. The lower shield layer 12 is often patterned to an appropriate size by the PR process. The magnetoresistive device 16 is patterned to an appropriate size by the PR process. A vertical bias layer 14 and a lower electrode layer 15 are then laminated such that they are partly overlap the magnetroresistance effect device 16. An upper gap layer 18 and an upper shield layer 19 are then laminated on the wafer.

The lower shield layer of the type as shown in FIGS. 1 and 2 may be formed by using NiFe, CoZr, CoFeB, CoZrMo, CoZrNb, CoZr, CoZrTa, CoHf, CoTa, CoTaHf, CoNbHf, CoZrNb, CoHfPd, COTaZrNb, CoZrMoNi, FeAlSi, ironnitridetypematerials, etc., and its thickness may range from 0.3 to 10 $\mu$m. The lower gap layer may be formed by using aluminum, $SiO_2$, aluminum nitride, silicon nitride, diamond-like carbon, etc., and its thickness is desirably in a range of 0.01 to 0.20 $\mu$m. The lower electrode layer is desirably formed by using Zr, Ta and Mo either alone or in the form of alloys or mixtures, and its thickness suitably ranges from 0.01 to 0.10 $\mu$m. The vertical bias layer may be formed by using CoCrPt, CoCr, CoPt, CoCrTa, FeMn, NiMn, IrMn, PtPdMn, ReMn, PtMn, CrMn, Ni oxide, Fe oxide, mixtures of Ni oxide and Co oxide, mixtures of Ni oxide and Fe oxide, an Ni oxide/Co oxide two-layer film, an Ni oxide/Fe oxide two-layer film, etc. The gap regulation insulating layer may be formed by using aluminum, $SiO_2$, aluminum nitride, silicon nitride, diamond-like carbon, etc., and its thickness may range from 0.005 to 0.05 $\mu$m. The upper gap layer may be formed by using aluminum, $SiO_2$, aluminum nitride, silicon nitride, diamond-like carbon, etc., and its thickness is desirably in a range of 0.01 to 0.20 $\mu$m. The upper shield layer may be formed by using NiFe, CoZr, CoFeB, CoZrMo, CoZrNb, CoZr, CoZrTa, CoHf, CoTa, CoTaHf, CoNbHf, CoZrNb, CoHfPd, CoTaZrNb, CoZrMoNi, FeAlSi, iron nitride type materials, etc., and its thickness may range from 0.3 to 10 $\mu$m.

Figure 3:
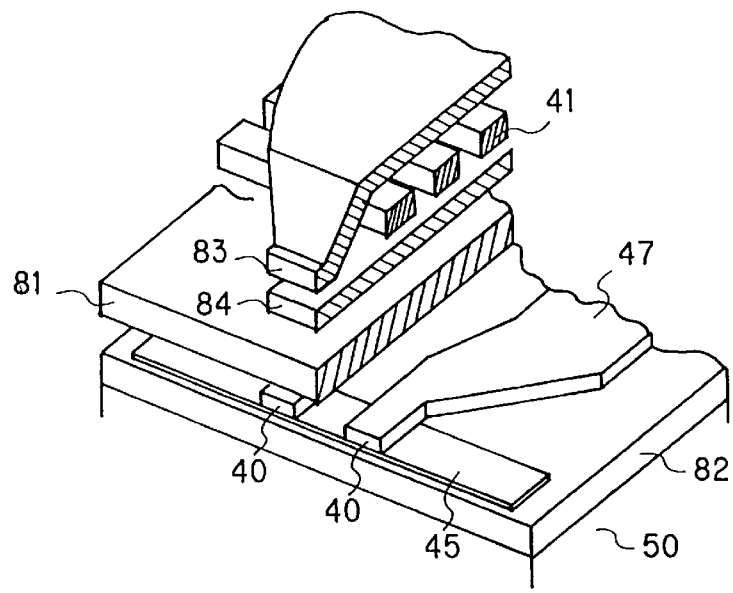
FIG. 3 schematically shows a recording/reproducing head according to the present invention.

The magnetoresistive sensors of shield type as above may be used as recording/reproducing head by forming a write head section constituted by an inductive coil. FIG. 3 schematically shows a recording/reproducing head. This recording/reproducing head comprises a reproducing head using the magnetroresistive sensor according to the present invention and a recording head of inductive type. While this example of head is a combination of the magnetoresistive device according to the present invention with the recording head for longitudinal magnetic recording, it is also possible to combine the device according to the present invention with a perpendicular magnetic recording head for perpendicular recording.

Specifically, this recording/reproducing head comprises a reproducing head, which is formed on a substrate 50 and has a lower shield film 82, a magnetoresistive device 45, an electrode 40 and an upper shield film 81, and a recording head, which has a lower magnetic film 84, a coil 41 and an upper magnetic film 83. It is possible to use a common film in lieu of the upper shield film 81 and the lower magnetic film 83. This recording/reproducing head is adapted to write and read signals on and out of a recording medium. It will be seen that the sensitive section of the reproducing head and the magnetic gap of the recording head can be positioned at a time on the same track by forming them on the same slider at an overlapped position thereof. Thus recording/reproducing head was processed to a slider and mounted in a magnetic recording/reproducing apparatus.

Figure 4:
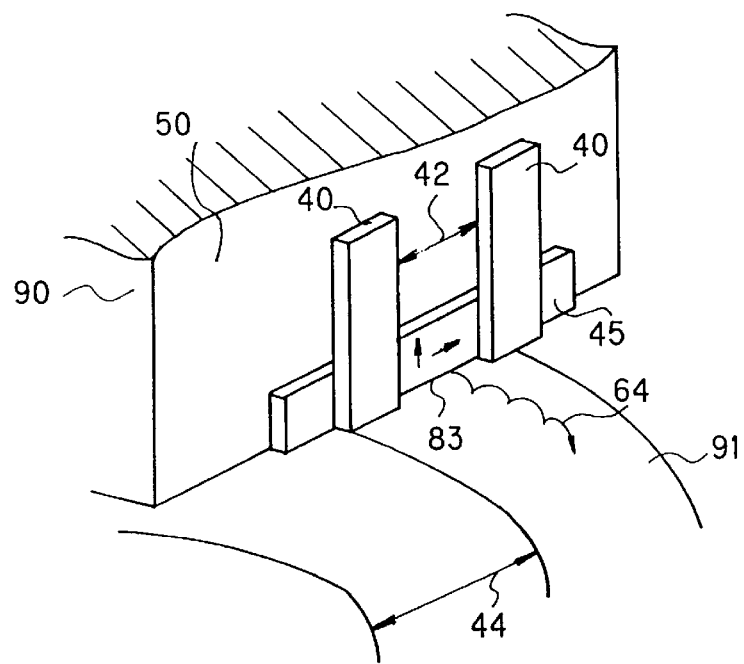
FIG. 4 schematically shows a magnetic recording/reproducing apparatus using the magnetoresistive device according to the present invention.

FIG. 4 schematically shows a magnetic recording/reproducing apparatus using the magnetoresistive device according to the present invention. The apparatus comprises a magnetoresistive device 45 and an electrode film 40, which are formed on a substrate 50 which also serves as a head slider 90 and positioned on a magnetic recording medium 91 for reproducing. The magnetic recording medium 91 is rotated, and the head slider 90 is moved therealong at a height of 0.2 μm or below or incontact therewith. With this mechanism, the magnetoresistive device 45 is set at a position to be above to read magnetic signal recorded on the magnetic recording medium 91 from leakage field of the signal.

Figure 5:
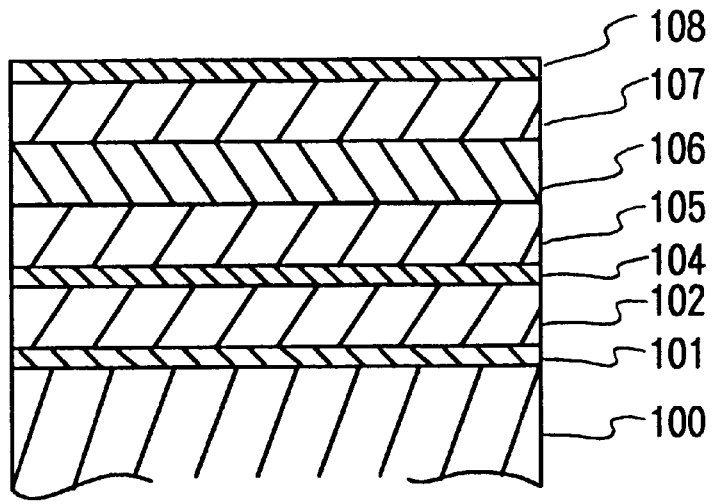
FIGS. 5 to 12 are schematic views showing examples of the film structure of the magnetoresistive device according to the present invention.
Figure 6:
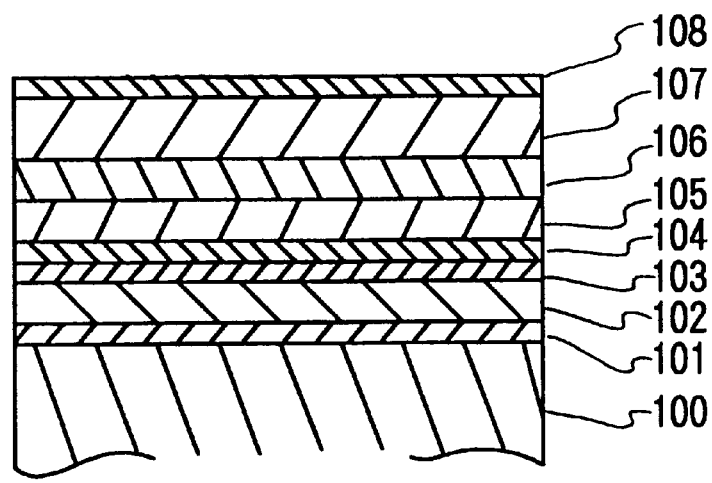
Figure 7:
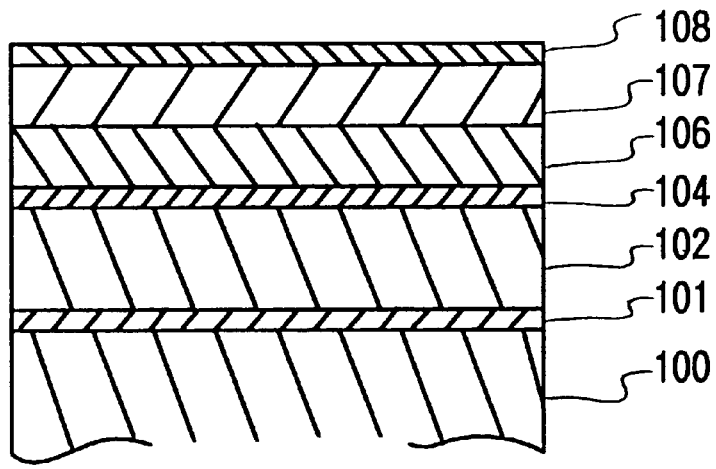
Figure 8:
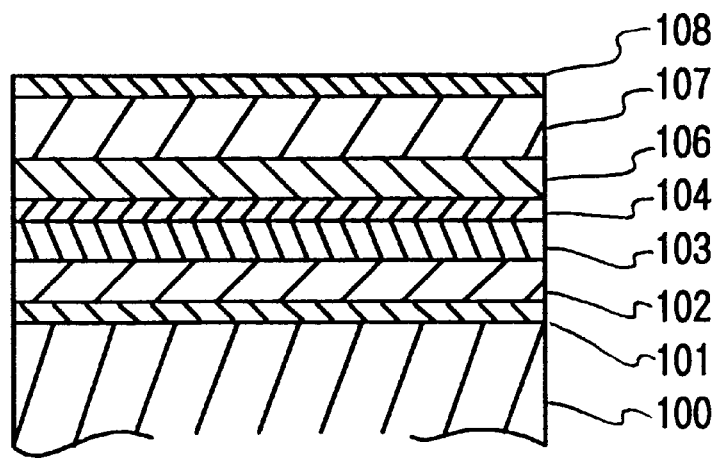
Figure 9:
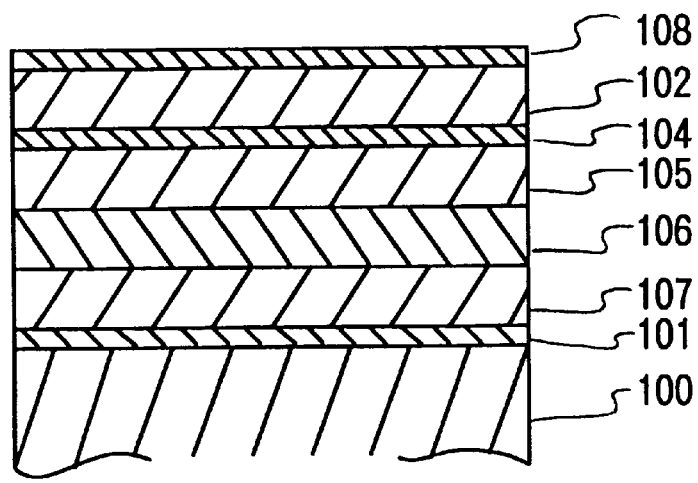
Figure 10:
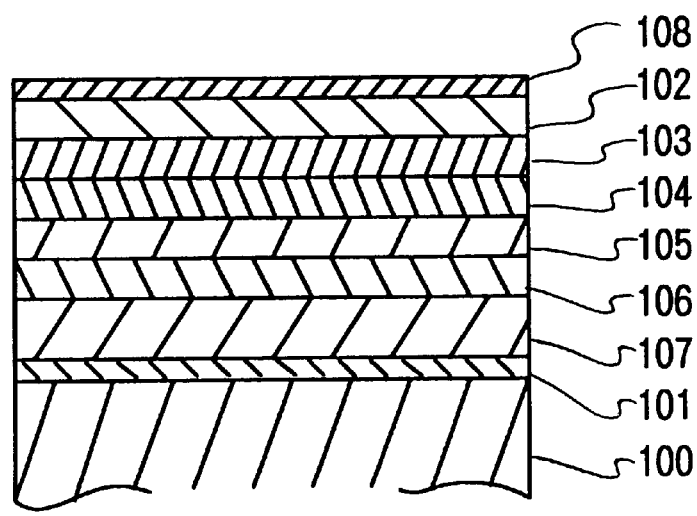
Figure 11:
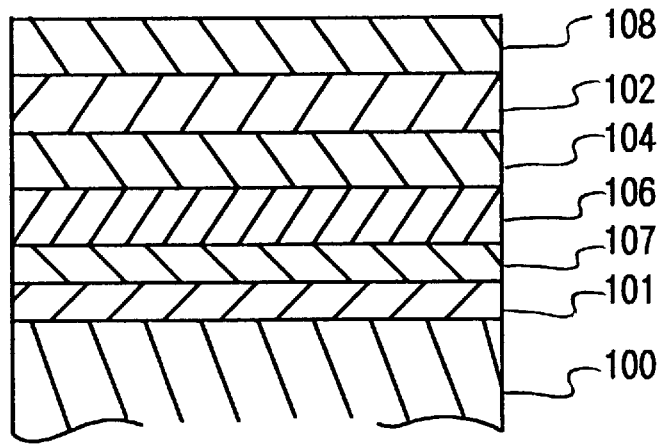
Figure 12:
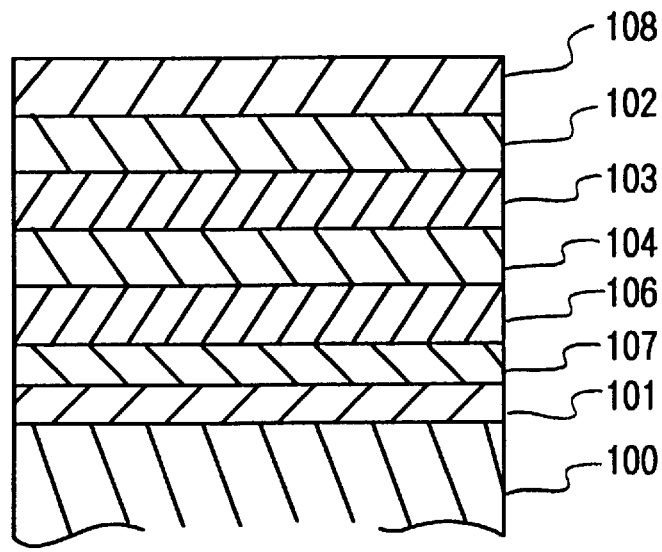

FIGS. 5 to 12 are schematic views showing examples of the film structure of the magnetoresistive device according to the present invention. The magnetoresistive device shown in FIG. 5 is obtained by laminating an under layer 101, a first free magnetic layer 102, a non-magnetic layer 104, an MR enhancement layer 105, a fixed magnetic layer 106, an anti-ferromagnetic layer 107 and a protective layer 108 in this order on a substrate 100. The magnetroresistive device shown in FIG. 6 is formed by laminating an under layer 101, a first free magnetic layer 102, a second free magnetic layer 103, a non-magnetic layer 104, an MR enhancement layer 105, a fixed magnetic layer 106, an anti-ferromagnetic layer 107 and a protective layer 108 in this order on a substrate 100. The magnetoresistive device shown in FIG. 7 is obtained by laminating an under layer 101, a first free magnetic layer 102, a non-magnetic layer 104, a fixed magnetic layer 106, an anti-ferromagnetic layer 107 and a protective layer 108 in this order on a substrate 100. The magnetoresistive device shown in FIG. 8 is formed by laminating an under layer 101, a first free magnetic layer 102, a second free magnetic layer 103, a non-magnetic layer 104, a fixed magnetic layer 106, an anti-ferromagnetic layer 107 and a protective layer 108 in this order on a substrate 100. The magnetoresistive device shown in FIG. 9 is obtained by laminating an under layer 101, an anti-ferromagnetic layer 107, a fixed magnetic layer 106, an MR enhancement layer 105, a non-magnetic layer 104, a first free magnetic layer 102 and a protective layer 108 in this order on a substrate 100. The magnetoresistive device shown in FIG. 10 is obtained by laminating an under layer 101, an anti-ferromagnetic layer 107, a fixed magnetic layer 106, an MR enhancement layer 105, a non-magnetic layer 104, a second free magnetic layer 103, a first free magnetic layer 102 and a protective layer 108 in this order on a substrate 100. The magnetoresistive device shown in FIG. 11 is obtained by laminating an under layer 101, an anti-ferromagnetic layer 107, a fixed magnetic layer 106, a non-magnetic layer 104, a first free magnetic layer 102 and a protective layer 108 in this order on a substrate 100. The magnetoresistive device shown in FIG. 12 is obtained by laminating an under layer 101, an anti-ferromagnetic layer 107, a fixed magnetic layer 106, a non-magnetic layer 104, a second free magnetic layer 103, a first free magnetic layer 102 and a protective layer 108 in this order on a substrate 100.

The under layer is a multi-layer film formed by using two or more different metals, e.g., Ta, Hf, Zr, W, Cr, Ti, Mo, Pt, Ni, Ir, Cu, Ag, Co, Zn, Ru, Rh, Re, Au, Os, Pd, Nb, V, etc. For example, the layer is formed to a thickness of 0.2 to 6.0 nm by using Ta, to a thickness of 0.2 to 1.5 nm by using Hf or to a thickness of 0.2 to 2.5 nm by using Zr.

The first and second free magnetic layers may be formed by using NiFe, CoFe, NiFeCo, FeCo, CoFeB, CoZrMo, CoZrNb, CoZr, CoZrTa, CoHf, CoTa, CoTaHf, CoNbHf, CoZrNb, CoHfPd, CoTaZrNb, CoZrMoNi and amorphous magnetic materials. Their thickness is suitably 1 to 10 nm, preferably 0.1 to 5 nm. The non-magnetic layer may be formed by using Cu, Cu with about 1 to 20 at. % of added Ag, Cu with about 1 to 20 at. % of added Re, and CuAu alloys. Its thickness is suitably 2 to 4 nm. The MR enhancement layer may be formed by using Co, NiFeCo, FeCo, etc., or CoFeB, CoZrMo, CoZrNb, CoZr, CoZrTa, CoHf, CoTa, CoTaHf, CoNbHf, CoZrNb, CoHfPd, CoTaZrNb, CoZrMoNi and amorphous magnetic materials. Its thickness is suitably 0.5 to 5 nm. Where the MR enhancement layer is not used., the MR ratio is slightly reduced compared to the case where the layer is used. However, without use of the layer, the number of steps in manufacture is correspondingly reduced. The fixed magnetic layer is formed from a monomer, an alloy or a laminate of an element group with Co, Ni or Fe as base. Its thickness is suitably 1 to 50 rm. The anti-ferromagnetic layer may be obtained by using FeMn, NiMn, IrMn, PtPdMn, ReMn, PtMn, CrMn, Ni oxide, Fe oxide, mixtures of Ni oxide and Co oxide, mixtures of Ni oxide and Fe oxide, Ni oxde/Co oxide two-layer film, Ni oxide/Fe oxide two-layer film, etc. The protective layer may be formed by using an oxide or a nitride of a member of the group consisting of Al, Si, Ta and Ti, a member of the group consisting of Cu, Au, Ag, Ta, Hf, Zr, Ir, Si, Pt, Ti, Cr, Al and C or mixtures or laminates of these members. By using the protective layer, the corrosion resistance can be improved. Without use of the layer, on the other hand, the number of steps in manufacture is reduced to improve the productivity.

To compare the spin valve according to the present invention, various properties of the magnetoresistive device having the structure as shown in FIG. 5 were examined, in the case of using a 5 nm thick Hf mono-layer film for the under layer 101. As the substrate 101 was used a 1.1 nm thick glass substrate of corning glass 7059. As the first free magnetic layer 102 was formed a 8.0 rn thick $N_{81}Fe_{19}$ (at. %), target composition when forming film by spattering and different from the film composition), this being the same with the following elements as well) film, as the non-magnetic layer 104 a 2.,8 nm Cu film, as the MR enhancement layer 105 a 0.4 nm $Co_{90}Fe_{10}$ (at. %) film, as the fixed magnetic layer 106 a 2.6 nm $Ni_{81}Fe_{19}$ (at. %) film, as the anti-ferromagnetic layer 107 a 30 nm $Ni_{46}Mn_{54}$ (at. %) film, and as the protective layer 108 a 3.0 nm Ta film. The structure obtained by the film formation was heat treated in a vacuum of $2\times10^{-6}$ Pa at 270° C. for 5 hours for providing an exchange coupled force applied from the NiMn layer to the fixed magnetic layer. As test results that were obtained, the coercive force of the free magnetic layers is 2.5 Oe, the exchange coupled field applied form the anti-ferromagnetic layer to the fixed magnetic layer was 460 Oe, and the magnetoresistive ratio was 2.8%.

Various further properties of the magnetoresistive device having the structure as shown in FIG. 5 were examined in the case of using a two-layer film as the under layer 101 and varying the thickness of a second ground sub-layer with a fixed thickness of a first ground sub-layer. As the substrate 100 was used a 1.1 mm thick glass substrate of corning 7059. As the first free magnetic layer 102 was formed an 8.0 nm thick $Ni_{81}Fe_{19}$ (at. %) film, as the non-magnetic layer 104 a 2.8 nm thick Cu film, as the MR enhancement layer 105 a 0.4 nm tick $Co_{90}Fe_{10}$ (at. %) film, as the fixed magnetic layer 106 a 2.6 nm thick $Ni_{81}Fe_{19}$ (at. %) film, as the anti-ferromagneic layer 107 a 30 nm thick NiMn film, and as the protective layer 108 a 3.0 nm thick Ta film. The structure obtained by the film formation was heat treated in a vacuum of $2\times10^{-6}$ Pa at 270° C. for 5 hours for providing an exchange coupled force applied from the NiMn layer to the fixed magnetic layer. As the first ground sub-layer was formed a 3 nm thick Hf film, and as the second ground sub-layer, the thickness of which was varied, was formed a Ta film.

Figure 13:
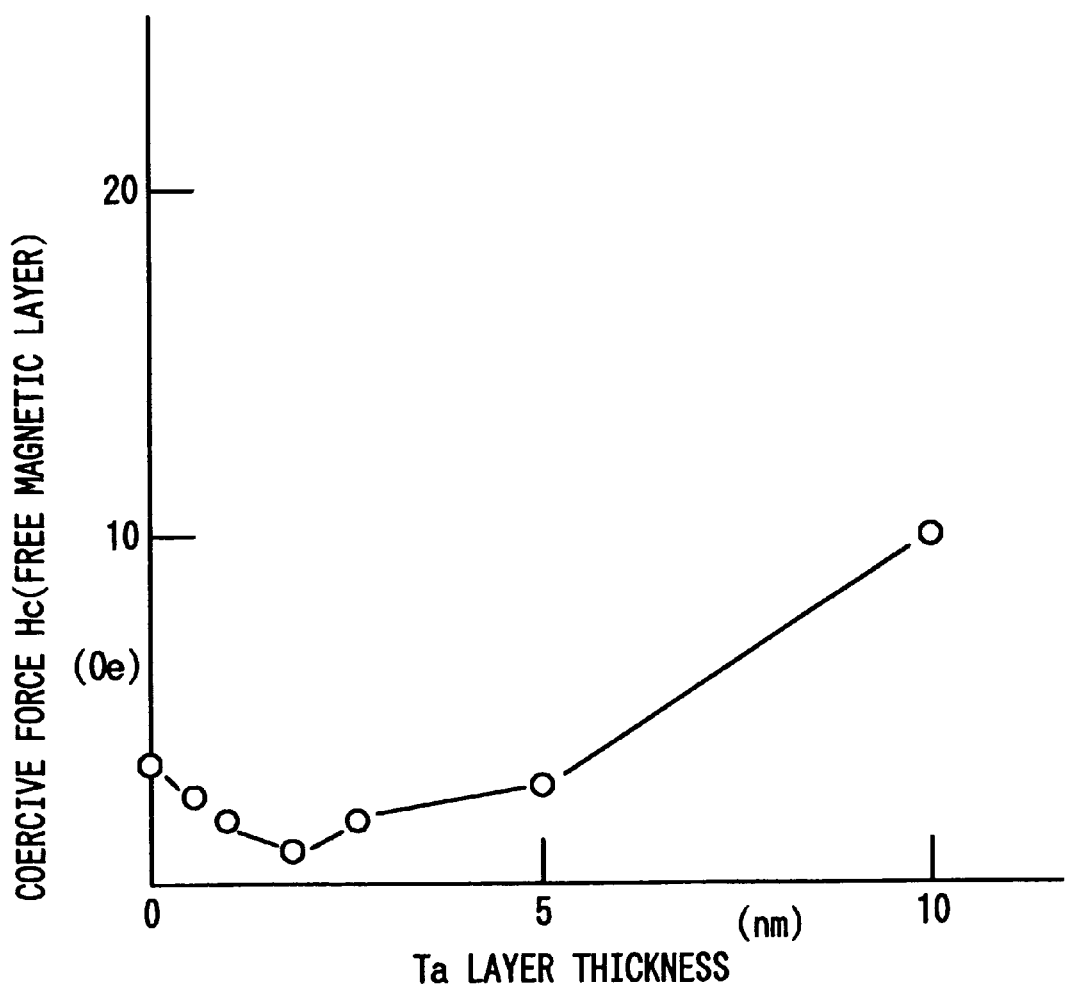
FIG. 13 shows an obtained relation between the coercive force Hc of the free magnetic layers and the thickness of the Ta film for the present invention.
Figure 14:
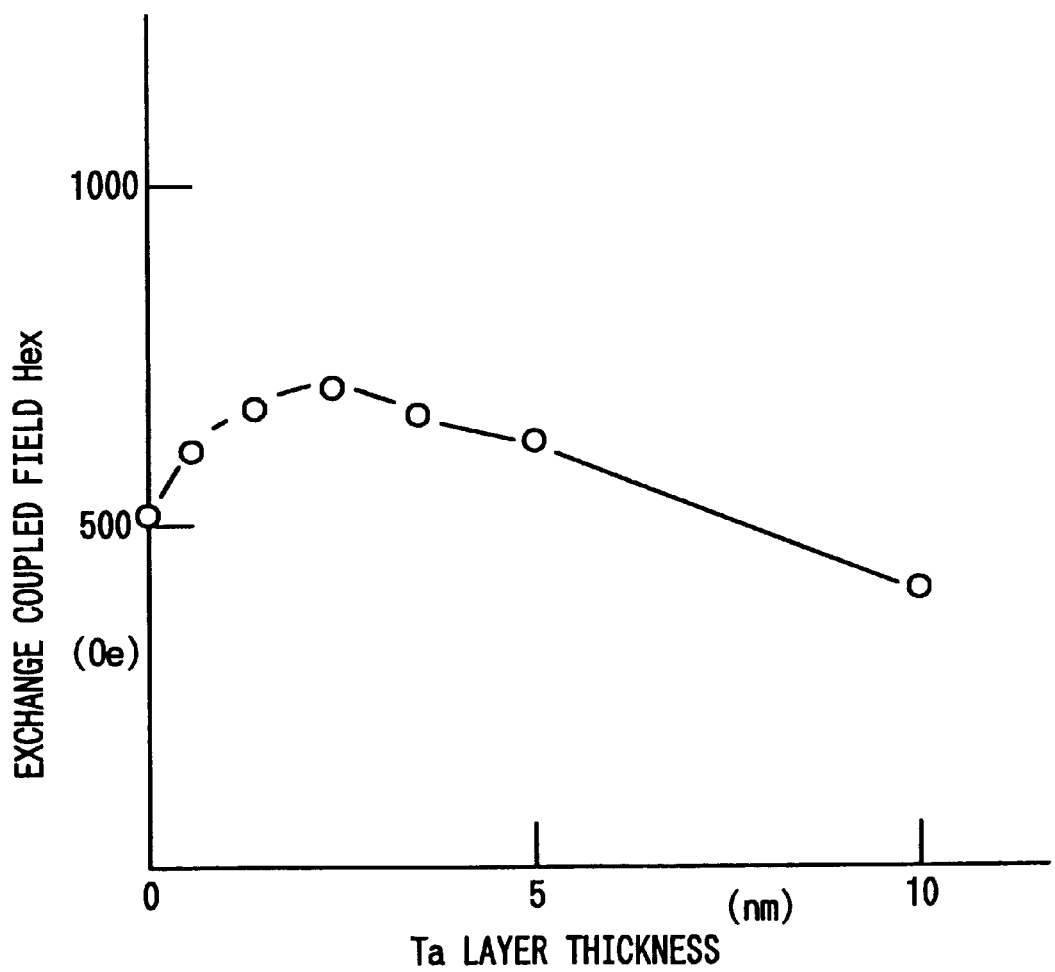
FIG. 14 shows an obtained relation between the exchange coupled field Hex applied from the anti-ferromagnetic layer to the fixed magnetic layer and the thickness of the Ta film for the present invention.
Figure 15:
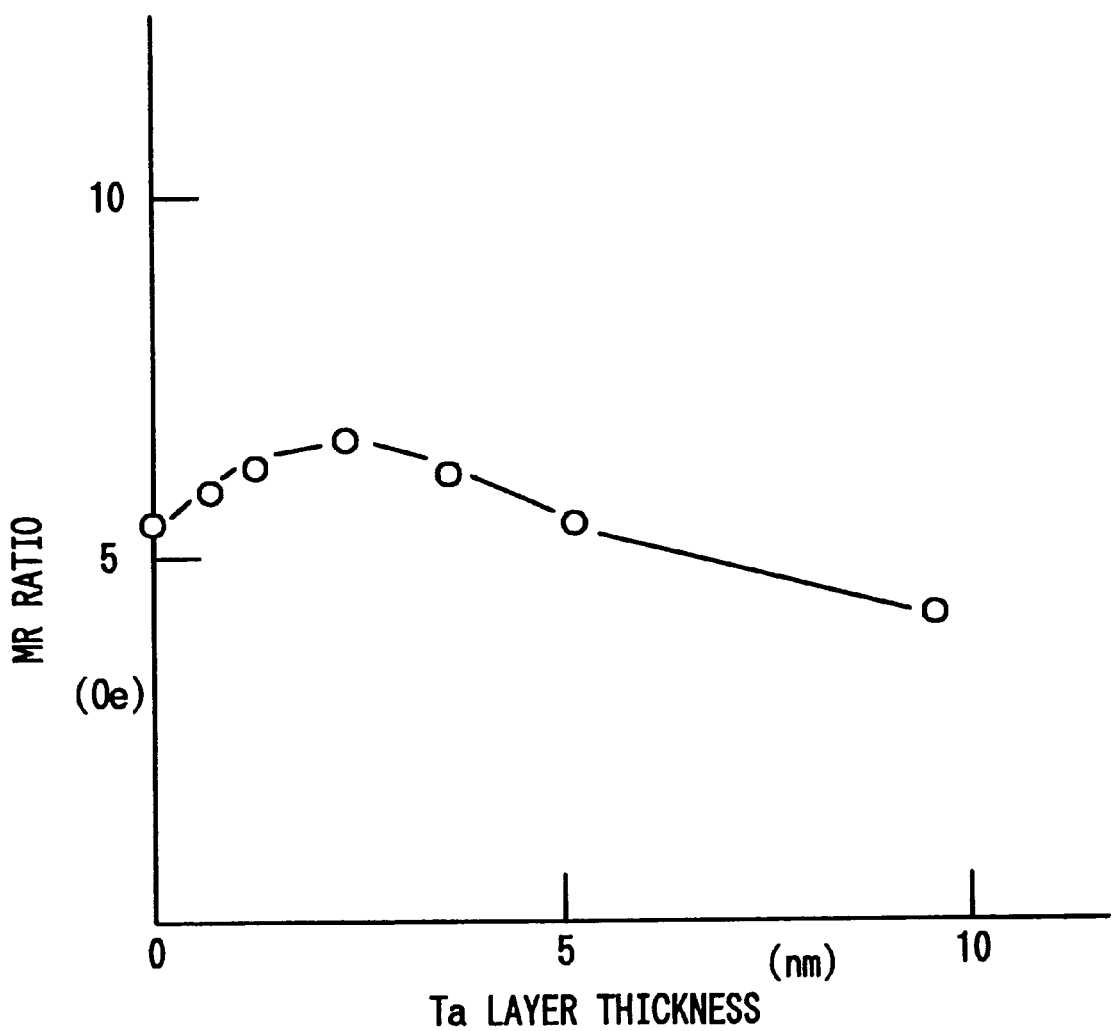
FIG. 15 shows an obtained relation between the magnetoresistive ratio (MR ratio) and the thickness of the Ta film for the present invention.

FIG. 13 shows an obtained relation between the coercive force Hc of the free magnetic layers and the thickness of the Ta film. FIG. 14 shows an obtained relation between the exchange coupled field Hex applied from the anti-ferromagnetic layer to the fixed magnetic layer and the thickness of the Ta film. FIG. 15 shows an obtained relation between the magnetoresistive ratio (MR ratio) and the thickness of the Ta film. When the thickness of the Ta film was 2.0 nm, the Hc of the free magnetic layers was minimum, and also the Hex and the MR ratio were maximum. This is thought to be presumably owing to the most advantageous condition of atoms in the Ta layer in the proximity of the upper surface contiguous to the free magnetic layer for the crystal growth thereof when the Ta layer thickness is 2.0 nm. It is thought that the Ta layer is not under the best condition with a less thickness due to reflection of the Hf structure of the first ground sub-layer on the atomic structure of the Ta layer, and with a greater thickness due to preference given to the crystal growth of the Ta layer.

Various further properties of the magnetoresistive device having the structure as shown in FIG. 5 was examined, in the case of using a two-layer film as the under layer 101 and varying the thickness of a first ground sub-layer with a fixed thickness of a second ground sub-layer. As the substrate 100 was used a 1.1 nm thick glass substrate of corning 7059. As the first free magnetic layer 102 was formed an 8.0 nm thick $Ni_{81}Fe_{19}$ (at. %) film, as the non-magnetic layer 104 was used a 2.8 nm thick Cu film, as the MR enhancement layer 105 a 0.4 nm thick $Co_{90}Fe_{10}$ (at. %) film, as the fixed magnetic layer 106 a 2.6 nm thick $Ni_{81}Fe_{19}$ (at. %) film, as the anti-ferromagnetic layer 107 a 30 nm NiMn film, and as the protective layer 106 a 3.0 nm Ta film. The structure obtained by the film formation was heat treated in a vacuum of $2 \times 10^{-6}$ Pa at 270° C. for 5 hours for providing an exchange coupled force applied from the NiMn layer to the fixed magnetic layer. As the second ground sub-layer was formed a 2 nm Ta layer, and as the first under layer, the thickness of which was varied, was formed a Hf layer.

Figure 16:
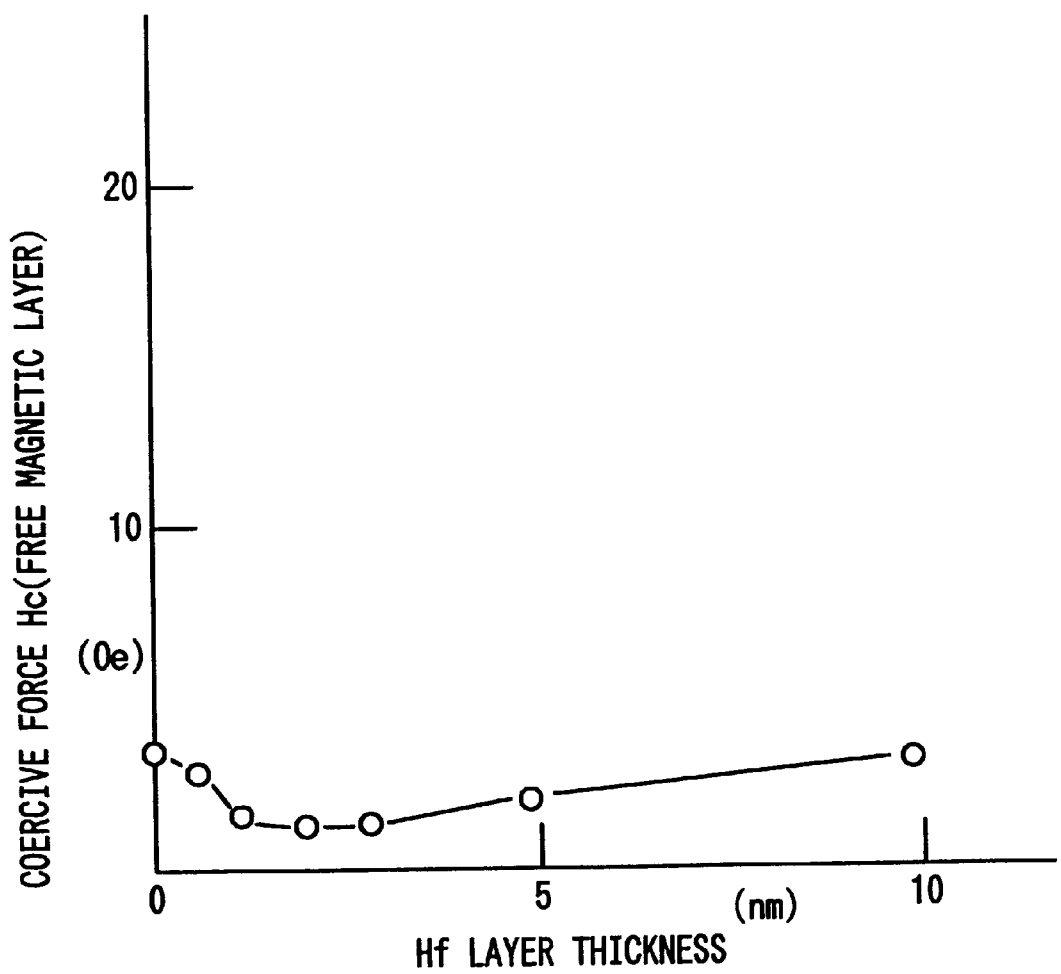
FIG. 16 shows an obtained relation between the Hc of the free magnetic layers and the Hf layer thickness for the present invention.
Figure 17:
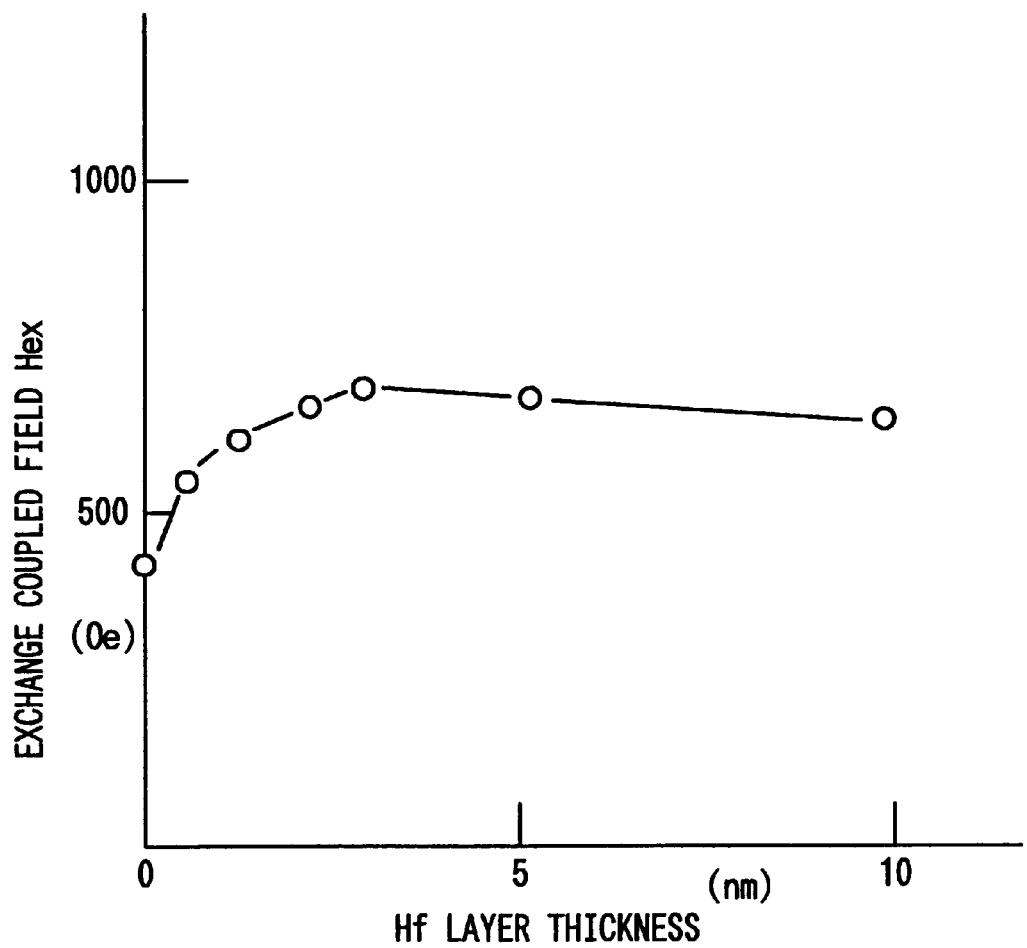
FIG. 17 shows an obtained relation between the exchange coupled field Hex applied from the anti-ferromagnetic layer to the fixed magnetic layer and the Hf layer thickness for the present invention.
Figure 18:
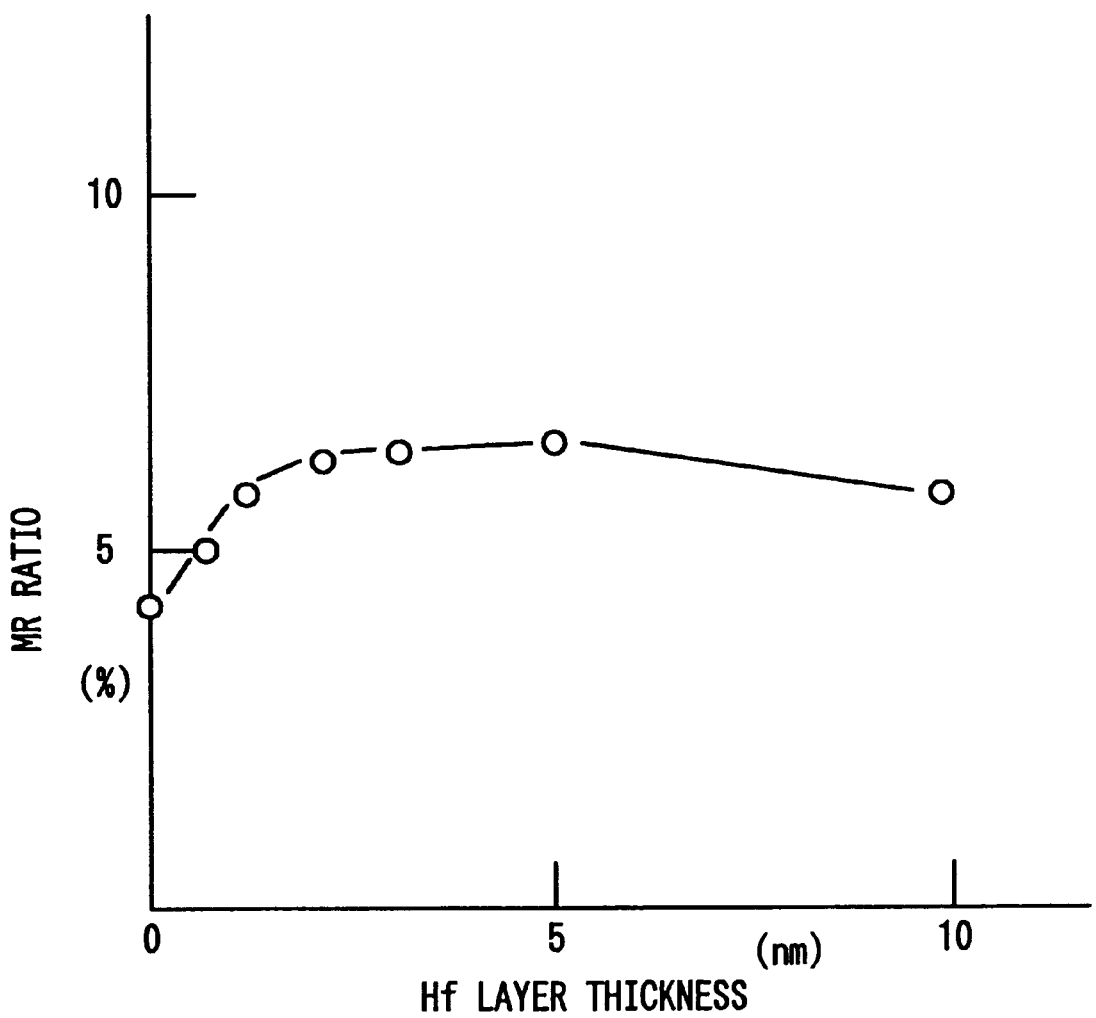
FIG. 18 shows an obtained relation between the magnetoresistive ratio (MR ratio) and the Hf layer thickness for the present invention.

FIG. 16 shows an obtained relation between the Hc of the free magnetic layers and the Hf layer thickness. FIG. 17 shows an obtained relation between the exchange coupled field Hex applied from the anti-ferromagnetic layer to the fixed magnetic layer and the Hf layer thickness. FIG. 18 shows an obtained relation between the magnetoresistive ratio (MR ratio) and the Hf layer thickness. When the Hf layer thickness was 2 to 3 nm, the Hc of the free magnetic layers was minimum, and also the Hex and the MR ratio were maximum. This is thought to be presumably owing to the most advantageous condition of atoms in the Ta layer in the proximity of the upper surface contiguous to the free magnetic layer for the crystal growth of the free magnetic layers when the Hf layer thickness is 2 to 3 nm. It is thought that the Ta layer is not under the best condition with a less thickness because in this case the Hf structure of the first ground sub-layer is not reflected upon the atomic structure of the Ta layer, and with a greater thickness because in this case the influence of the Hf layer is excessive.

Various further properties of the magnetoresistive device having the structure as shown FIG. 5 were examined, in the case of using a two-layer film as the under layer 101. As the substrate 100 was used a 1.1 mm thick glass substrate of corning 7059. As the first free magnetic layer 102 was formed an 8.0 nm thick $Ni_{81}Fe_{19}$ (at. %) film, as the non-magnetic layer 104 a 2.8 nm thick Cu film, as the MR enhancement layer 105 a 0.4 nm thick $Co_{90}Fe_{10}$ (at. %) film, as the fixed magnetic layer 106 a 2.6 nm $Ni_{81}Fe_{19}$ (at. %) film, as the anti-ferromagnetic layer 107 a 30 nm thick NiMn film, and as the protective layer 108 a 3.0 nm thick Ta film. The structure thus obtained by the film formation was heat treated under a vacuum of $2 \times 10^{-6}$ Pa at 270° C. for 5 hours for providing an exchange coupled force applied from the NiMn layer to the fixed magnetic layer.

FIGS. 19 to 24 show the coercive force of the free magnetic layers, the exchange coupled field (Oe) applied from the anti-ferromagnetic layer to the fixed magnetic layer, and the magnetoresistive ratio (%), obtained in cases of using combinations of members of the group consisting of Ta, Hf, Zr, W, Cr, Ti, Mo, Pt, Ni, Ir, Cu, Ag, Co, Zn, Ru, Rh, Re, Au, Os, Pd,Nb and V. In the Figure, the first row in each item lists the coercive force (Oe), the second row lists the exchange coupled field, and the third row lists the magnetoresistive ratio.

In either case, the magnetoresistive change rate is increased compared to the case of using an Hf mono-layer film as the under layer. This is thought to be owing to suppression of dispersion of atoms in the interfaces of the Cu layer, free magnetic layers and fixed magnetic layer even after the heat treatment at 270° C. for 5 hours owing to improvement of the crystal structure of the grown layer by the effect of the under layer.

Various further properties of the magnetoresistive device having the structure as shown in FIG. 5 were examined with different kinds of anti-ferromagnetic layer. As the substrate 100 was used a 1.1 mm thick glass substrate of corning 7059. As the under layer 101 was formed an Hf (3 nm thick)/Ta (2 nm thick) two-layer film, as the first free magnetic layer 102 was formed an 8.0 nm thick $Ni_{81}Fe_{19}$ (at. %) film, as the non-magnetic layer 104 a 2.8 nm thick Cu film, as the MR enhancement layer 105 a 0.4 nm thick $Co_{90}Fe_{10}$ (at. %) film, as the fixed magnetic layer 106 a 2.6 nm thick $Ni_{81}Fe_{19}$ (at. %) film, and as the protective layer 108 a 3.0 nm Ta film. The structure obtained was heat treated for providing an exchange coupled field from the anti-ferromagnetic layer to the fixed magnetic layer. FIG. 25 shows the Hex and the MR ratio obtained with various anti-ferromagnetic layers.

Various further properties of the magnetoresistive devices having the structures as shown in FIGS. 5 to 12 were examined. As the substrate 100 was used a 1.1 mm thick glass substrate of corning 7059. As the under layer 101 was formed a Hf (3 nm thick)/Ta (2 nm thick) two-layer film, as the first free magnetic layer 102 a 60 nm thick $Ni_{81}Fe_{19}$ (at. %) film, as the second free magnetic layer 103 a 1.0 nm $Co_{90}Fe_{10}$(at. %) film, as the non-magnetic layer 104 a 2.8 nm thick Cu film, as the MR enhancement layer 105 a 1.0 nm thick $Co_{90}Fe_{10}$ (at. %) film, as the fixed magnetic layer 106 a 2.6 nm thick $Ni_{81}Fe_{19}$ (at. %) film, as the anti-ferromagnetic layer 107 a 30 nm thick $Ni_{46}Mn_{54}$ (at. %) film, and as the protective layer 108 a 3.0 nm thick Ta film. The structures obtained by the film formation were heat treated at 270° C. for 5 hours for providing an exchange coupled field from the anti-ferromagnetic layer to the fixed magnetic layer. FIG. 26 shows the properties of the individual structures.

Examples of magnetoresistive device capable of being used according to the present invention, were trial produced by using various magnetic layers, and their resistivity change rates, resistivities and resistivity changes were measured. Specifically, these properties were measured by using different magnetic layers as first free magnetic layer 102 in the magnetoresistive device having the structure as shown in FIG. 5. As the substrate 100 was used a 1.1 mm thick glass substrate of corning 7059. As the under layer 101 was formed a Hf (3 nm thick)/Ta (2 nm thick) two-layer film, as the non-magnetic layer 104 a 2.8 nm thick $Ag_1Cu_{99}$ (at. %) film, as the MR enhancement layer 105 a 1 nm thick $Co_{90}Fe_{10}$ (at. %) film, as the fixed magnetic layer 106 a 2.6 nm thick $Ni_{81}Fe_{19}$ (at. %) film, and as the protective layer 108 a 3.0 nm thick Ta film. The structures obtained by the film formation were heat treated for providing an exchange coupled field from the anti-ferromagnetic layer to the fixed magnetic layer. FIG. 27 shows Hex and MR ratio obtained with the different magnetic layers used as the first free magnetic layer.

In an experiment, a magnetoresistive effect device having a laminate structure of glass substrate/Hf (3 nm thick)/Ta (2 nm thick)/$Ni_{82}Fe_{18}$ (3 nm thick)/Ru (0.4 nm thick)/$Ni_{82}Fe_{18}$ (3 nm thick)/Cu (2.5 nm thick)/$Co_{90}Fe_{10}$ (3.0 nm thick)/$Ni_{46}Mn_{54}$ (30 nm thick) was produced. The film formation was done in an applied magnetic field of 50 m Oe by using a magnetron spattering apparatus. An M-H curve was drawn by applying magnetic fields to the device in a direction parallel to the film formation field, and a resistivity change rate of 4.8% was obtained. With this film structure, satisfactory magnetic field sensitivity could be obtained even with a device patterned to as width of 1 $\mu$m. This is thought to be attributable to very low effective magnetization of the free magnetic layers, and hence low magnetostatic coupling between the fixed magnetic layer and the free magnetic layers, owing to the anti-ferromagnetic coupling of the two $Ni_{82}Fe_{18}$ layers in the laminate part of $Ni_{82}Fe_{18}$ (3 nm thick)/Ru (0.4 nm thick)/$Ni_{82}Fe_{18}$ (3 nm thick) via Ru. In zero applied magnetic field, the resistivity of the device was 29 $\mu\Omega$cm, and the resistivity change rate thereof was 1.5 $\mu\Omega$cm.

In another experiment, a magneto-resistive device having a laminate structure of glass substrate Hf(3 nm thick)/Ta (2 nm thick)/$Ni_{82}Fe_{18}$ (8 nm thick)/Cu (2.5 nm thick)/$Co_{90}Fe_{10}$ (2 nm thick)/Ru (0.4 nm thick)/$Co_{90}Fe_{10}$ (2 nm thick)/$Ni_{46}Mn_{54}$ (30 nm thick) was produced. The film formation was done in an applied magnetic field of 500 Oe by using a magnetron spattering apparatus. An M-H curve was drawn by applying magnetic fields to the device in a direction parallel to the film formation field, and a resistivity change rate of 4.9% was obtained. With this film structure, satisfactory magnetic sensitivity could be obtained even with a device patterned to a width of 1 $\mu$m. This is thought to be attributable to very low effective magnetization of the free magnetic layers, and hence low magnetostatic coupling between the fixed magnetic layer and the free magnetic layers, owing to the anti-ferromagnetic coupling of the two CoFe layer in the laminate part of $Co_{90}Fe_{10}$ (2 nm thick)/Ru (0.4 nm thick)/$Co_{90}Fe_{10}$ (2 nm thick) via Ru. In zero applied magnetic field, the resistivity of the device was 28 $\mu\Omega$cm, and the resistivity change rate thereof was 1.3 $\mu\Omega$cm.

In other experiment, a magnetoresistive effect device having a laminate structure of glass substrate Hf (3 nm thick)/Ta (2 nm thick)/$Ni_{46}Mn_{54}$ (30 nm thick)/$Co_{90}Fe_{10}$ (3 nm thick)/Ru (0.4 nm thick)/$Co_{99}Fe_{10}$ (3 nm thick)/Cu (2.5 nm thick)/$Co_{92}Zr_3Nb_5$ (3 nm thick)/Ru (0.4 nm thick)/$Co_{92}Zr_3Nb_5$ (3 nm thick) was produced. The film formation was done in an applied magnetic field of 500 Oe by using a magnetron spattering apparatus. An M-H curve was drawn by applying magnetic fields to the device in a direction parallel to the film formation field, and a resistivity change rate of 4.5% was obtained. With this film structure, satisfactory magnetic sensitivity could be obtained even with a device patterned to a width of 1 $\mu$m. This is thought to be attributable to very low effective magnetization of the free magnetic layers, and hence low magnetostatic coupling between the fixed magnetic layer and the free magnetic layers, owing to the anti-ferromagnetic coupling of the two CoFe layer in the laminate part of $Co_{90}Fe_{10}$ (2 nm thick)/Ru (0.4 nm thick)/$Co_{90}Fe_{10}$(2 nm thick) and the two $Co_{92}Zr_3Nb_5$ layers in the laminate part of $Co_{92}Zr_3Nb_5$ (3 nm thick)/Ru (0.4 nm thick)/$Co_{92}Zr_3Nb_5$ (3 nm thick)via Ru. In zero applied magnetic field, the resistivity of the device was 38 $\mu\Omega$cm, and the resistivity change rate thereof was 1.7 $\mu\Omega$cm.

Applications of the above magnetoresistive devices to magnetoresistive sensors of shield type will how be described. First, an example of application of the magnetoresistive device according to the present invention to the magnetoresistive sensor shown in FIG. 1 will be described. In this example, the lower shield layer was formed by using NiFe, and the lower gap layer was formed by using aluminum. As the magnetoresistive device was used the structure shown in FIG. 5. As the under layer 101 was formed a Hf (3 nm thick)/Ta (2 nm thick) two-layer film, as the first free magnetic layer 102 a 8.0 nm thick $Ni_{81}Fe_{19}$ (at. %) film, as the non-magnetic layer 104 a 2.8 nm thick Cu film, as the MR enhancement layer 105 a 0.4 nm thick $Co_{90}Fe_{10}$ (at. %) film, as the fixed magnetic layer 106 a 2.6 nm thick $Ni_{81}Fe_{19}$ (at. %) film, as the anti-ferromagnetic layer 107 a 30 nm thick $Ni_{46}Mn_{54}$ (at. %) film, and as the protective layer 108 a 3.0 nm thick Ta film. The film structure thus formed was then heat treated for providing an exchange coupled field from the anti-ferromagnetic layer to the fixed magnetic layer. The structure was then patterned in a PR process to a size of 1 ×1 $\mu$m. Lower electrode layers of CoCrPt and Mo were then formed such that they were continuous to the edges of the patterned structure. The upper gap layer was formed by using aluminum, and the upper shield layer was formed by using NiFe. The head thus obtained was then processed and slider processed to obtain the recording/ reproducing head as shown in FIG. 3, and used for recording and reproducing data on and from a CoCrTa type recording medium. The write track width was set to 1.5 $\mu$m, the write gap to 0.2 $\mu$m, the read track width to 1.0 $\mu$m, and the read gap to 0.21 $\mu$m. The coercive force of the medium was 2.5 kOe.

The reproduced output was measured by varying the recording mark length, and a frequency of 155 kFCI was obtained with a recording mark length corresponding to the reproduced output reduction to one half. The reproduced output was 1.2 mV peak-to-peak, and a waveform free from noise and having satisfactory symmetricity could be obtained. The signal-to-noise ratio was 26.4 dB, and the error rate was $10^{-6}$ or below. An environment test of the head was conducted under conditions of 80° C. and 500 Oe, and the error rate was not changed up to 2,500 hours. A current conduction test of the head was conducted with a current density of $2\times10^7 A/cm^2$ and at an ambient temperature of 80° C., and the resistance and the resistance change rate were not changed up to 1,000 hours.

Another example of application of the magnetoresistive device according to the present invention to the magnetoresistive sensor shown in FIG. 1 will be described. In this example, the lower shield layer was formed by using NiFe, and the lower gap layer was formed by using aluminum. As the magnetoresistive device was used the structure shown in FIG. 5. As the under layer 101 was formed a W (3 nm thick)/Ta (2 nm thick) two-layer film, as the first free magnetic layer 102 an 8.0 nm thick $Ni_{81}Fe_{19}$ (at. %) film, as the non-magnetic layer 104 a 2.8 nm thick Cu film, a the MR enhancement layer 105 a 0.4 nm thick $Co_{90}Fe_{10}$ (at. %) film, as the fixed magnetic layer 106 a 2.6 nm thick $Ni_{81}Fe_{19}$ (at.

%) film, as the anti-ferromagnetic layer 107 a 30 nm thick Ni$_{46}$Mn$_{54}$ (at. %) film, and as the protective layer 108 a 3.0 nm thick Ta film. The film structure thus formed was then heat treated for providing an exchange coupled field from the anti-ferromagnetic layer to the fixed magnetic layer. The structure was then patterned in a PR process to a size of 1×1 μm. Lower electrode layers of CoCrPt and Mo were then formed such that they were continuous to the edges of the patterned structure. The upper gap layer was formed by using aluminum, and the upper shield layer was formed by using NiFe. The head thus obtained was then processed and slider processed to obtain the recording/reproducing head as shown in FIG. 3, and used for recording and reproducing data on and from a CoCrTa type recording medium. The write track width was set to 1.5 μm, the write gap to 0.2 μm, the read track width to 1.0 μm, and the read gap to 0.21 μm. The coercive force of the medium was 2.5 Oe.

The reproduced output was measured by varying the recording mark length, and a frequency of 150 kFCI was obtained with a recording mark length corresponding to the reproduced output reduction to one half. The reproduced output was 1.1 mV peak-to-peak, and a waveform free from noise and having satisfactory symmetricity could be obtained. The signal-to-noise ratio was 26.0 dB, and the error rate was 10$^{-6}$ or below. An environment test of the head was conducted under conditions of 80° C. and 500 Oe, and the error rate was not changed up to 2,500 hours. A current condition test of the head was conducted with a current density of 2×10$^7$ A/cm$^2$ and at an ambient temperature of 80° C., and the resistance and the resistance change rate were not changed up to 1,000 hours.

A further example of application of the magnetoresitance effect device according to the present invention to magnetoresistive sensor shown in FIG. 1 will be described. In this example, the lower shield layer was formed by using NiFe, and the lower gap layer was formed by using aluiminum. As the magnetoresistive device was used the structure shown in FIG. 5. As the under layer 101 was formed a Zr (3 nm thick)/Ta (2 nm thick) two-layer film, as the first free magnetic layer 102 an 8.0 nm thick Ni$_{81}$Fe$_{19}$ (at. %) film, as the non-magnetic layer 104 a 2.8 nm thick Cu film, as the MR enhancement layer 105 a 0.4 nm thick Co$_{90}$Fe$_{10}$ (at. %) film, as the fixed magnetic layer 106 a 2.6 nm thick Ni$_{81}$Fe$_{19}$ (at. %) film, as the anti-ferromagnetic layer 107 a 30 nm thick Ni$_{46}$Mn$_{54}$ (at. %) film, and as the protective layer 103 a 30 nm thick Ta film. The structure thus formed was then heat treated for providing an exchange coupled field from the anti-ferromagnetic layer to the fixed magnetic layer. The structure was then patterned in a PR process to a size of 1×1 μm. Lower electrode layers of CoCrPt and Mo were then formed such that they were continuous to the edges of the patterned structure. The upper gap layer was formed by using aluminum, and the upper shield layer was formed by using NiFe. The head thus obtained was then processed and slider processed to obtain the recording/reproducing head shown in FIG. 3, and used for recording and reproducing data on and from a CoCrTa type recording medium. The write track width was set to 1.5 μm, the write gap to 0.2 μm, the read track width to 1.0 μm, and the read gap to 0.21 μm. The coercive force of the medium was 2.5 kOe.

The reproduced output was measured by varying the recording mark length, and a frequency of 158 kFCI was obtained with a recording mark length corresponding to the reproduced output reduction to one half. The reproduced output was 1.1 mV, and a waveform free from noise and having satisfactory symmetricity could be obtained. The signal-to-noise ratio was 26.3 dB, and the error rate was 10$^{-6}$ or below. An environment test of the head was conducted under conditions of 80° C. and 500 Oe, and the error rate was not changed up to 2,500 hours. A current conduction test of the head was conducted with a current density of 2×10$^7$ A/cm$^2$ and at an ambient temperature of 80° C., and the resistance and the resistance change rate were not changed up to 1,000 hours.

Now, an example of application of the magnetoresistive device according to the present invention to the magnetoresistive sensor shown in FIG. 2 will be described. In this example, the lower shield layer was formed by using FeTaN, and the lower gap layer was formed by using amorphous carbon. As the magnetoresistive device was used the structure shown in FIG. 6. As the under layer 101 was formed a Ta (5 nm thick)/Hf (2 nm thick) two-layer film, as the first free magnetic layer 102 a 6.0 nm thick Ni$_{81}$Fe$_{19}$ (at. %) film, as the second free magnetic layer 103 a 1.0 nm thick Co$_{90}$Fe$_{10}$ (at. %) film, as the non-magnetic layer 104 a 2.8 nm thick Cu film, as the MR enhancement layer 105 a 1.0 nm thick Co$_{90}$Fe$_{10}$ (at. %) film, as the fixed magnetic layer 106 a 2.6 nm thick Ni$_{81}$Fe$_{19}$ (at. %) film, as the anti-ferromagnetic layer 107 a 30 nm thick Ni$_{46}$Mn$_{54}$ (at. %) film, and as the protective layer 108 a 3.0 nm tick Ta film. The film structure thus formed was then heat treated for providing an exchange coupled field from the anti-ferromagnetic layer to the fixed magnetic layer. The structure was then patterned in a PR process to a size of 1×1 μm. Lower electrode layers of CoCrPt and Mo were then formed such that they partly overlap the patterned structure of the device. The upper gap layer was formed by using aluminum, and the upper shield layer was formed by using NiFe. The head thus obtained was then processed and slider processed to obtain the recording/reproducing head as shown in FIG. 3, and used for recording and reproducing data on and from a CoCrTa type recording medium. The write track width was set to 1.5 μm, the write gap to 0.2 μm, the read track width to 1.0 μm, and the read gap to 0.21 μm. The coercive force was 2.5 kOe.

The reproduced output was measured by varying the recording mark length, and a frequency of 160 kFCI was obtained with a recording mark length corresponding to the reproduced output reduction to one half. The reproduced output was 1.8 mV peak-to-peak, and a waveform free from noise and having satisfactory symmetricity could be obtained. The signalto-noise ratio was 26.8 dB, and the error rate was 10–6 or below. An environment test of the head was conducted under conditions of 80° C. and 500 Oe, and the error rate was not changed up to 2,500 hours. A current conduction test of the head was conducted with a current density of 2×10$^7$ A/cm$^2$ and at an ambient temperature of 80° C., and the resistance and the resistance change rate were not change up to 1,000 hours.

Another example of application of the magnetoresistive device according to the present invention to the magnetoresistive sensor shown in FIG. 2 will now be described. In this example, the lower shield layer was formed by using FeTaN, and the lower gap layer was formed by using amorphous carbon. As the magnetoresistive device was used the structure shown in FIG. 6. As the under layer 101 was formed a Ta (5 nm thick)/W (2 nm thick) two-layer film, as the first free magnetic layer 102 a 6.0 nm thick Ni$_{81}$Fe$_{19}$ (at. %) film, as the second free magnetic layer 103 a 1.0 nm thick Co$_{90}$Fe$_{10}$ (at. %) film, as the non-magnetic layer 104 a 2.9 nm thick Cu film, as the MR enhancement layer 105 a 1.0 nm thick Co$_{90}$Fe$_{10}$ (at. %) film, as the fixed magnetic layer 106 a 2.6 nm thick Ni$_{81}$Fe$_{19}$ (at. %) film, as the anti-ferromagnetic layer 107 a 30 nm thick Ni$_{46}$Mn$_{54}$ (at. %)

film, and as the protective layer 108 a 3.0 nm thick Ta film. The film structure thus formed was the heat treated for providing an exchange coupled field from the anti-ferromagnetic layer to the fixed magnetic layer. The structure was then patterned in a PR process to a size of 1×1 μm. Lower electrode layers of CoCrPt and Mo were then formed such that they partly overlap the patterned structure of the device. The upper gap layer was formed by using aluminum, and the upper shield layer was formed by using NiFe. The head thus obtained was then processed and slider processed to obtain the recording/reproducing head as shown in FIG. 3, and used for recording and reproducing data on and from a CoCrTa type recording medium. The write track width was set to 1.5 μm, the write gap to 0.2 μm, the read track width to 1.0 μm, and the read gap to 0.21 μm. The coercive force of the medium was set to 2.5 kOe.

The reproduced output was measured by varying the recording mark length, and a frequency of 160 kFCI was obtained with a recording mark length corresponding to the reproduced output reduction to one half. The reproduced output was 1.6 mV peak-to-peak, and a waveform free from noise and having satisfactory symmetricity could be obtained. The signal-to-noise ratio was 26.4 dB, and the error rate was $10^{-6}$ or below. An environment test of the head was conducted under conditions of 80° C. and 500 Oe, and the error rate was not changed up to 2,500 hours. A current conduction test of the head was conducted with a current density of $2\times10^7$ A/cm$^2$ and at an ambient temperature of 80° C., and the resistance and the resistance change rate were not changed up to 1,000 hours.

A further example of application of the magnetoresistive device according to the present invention to the magnetoresistive sensor shown in FIG. 11 will be described. In this example, the lower shield layer was formed by using FeTaN, and the lower gap layer was used by using amorphous carbon. As the magnetoresistive device was used the structure shown in FIG. 6. As the under layer 101 was formed a Ta (5 nm thick)/Hf (2 nm thick) film, as the first free magnetic layer a 6.0 nm thick $Ni_{81}Fe_{19}$ (at. %) film, as the second free magnetic layer 103 a 1.0 nm thick $Co_{90}Fe_{10}$ (at. %) film, as the non-magnetic layer a 2.8 nm thick Cu film, as the MR enhancement layer 105 a 1.0 nm thick $Co_{90}Fe_{10}$ (at. %) film, as the fixed magnetic layer 106 a 2.6 nm thick $Ni_{81}Fe_{19}$ (at. %) film, as the anti-ferromagnetic layer 107 a 30 nm thick $Ni_{46}Mn_{54}$ (at. %) film, as the protective layer 108 a 3.0 nm thick Ta film. The film structure thus formed was then treated for providing an exchange coupled field from the anti-ferromagnetic layer to the fixed magnetic layer. The structure was then patterned in a PR process to a size of 1×1 μm. Lower electrode layers of CoCrPt and Mo were then formed such that they partly overlap the patterned structure of the device. The upper gap layer was formed by using aluminum, and the upper shield layer was formed by using NiFe. The head thus obtained was then processed and slider processed to obtain the recording/reproducing head as shown in FIG. 3, and used for recording and reproducing data on and from a CoCrTa type recording medium. The write track width was set to 1.5 μm, the write gap to 0.2 μm, the read track width to 1.0 μm, and the read gap to 0.21 μm. The coercive force of the medium as 2.5 koe.

The reproduced output was measured by varying the recording mark length, and a frequency of 160 kFCI was obtained with a recording mark length corresponding to the reproduced output reduction to one half. The reproduced output was 1.8 mV peak-to-peak, and a waveform free from noise and having satisfactory symmetricity could be obtained. The signal-to-noise ratio was 26.8 dB, and the error rate was $10^{-6}$ or below. An environment test of the head was conducted under conditions of 80° C. and 500 Oe, and the error rate was not changed up to 2500 hours. A current conduction test of the head was conducted with a current density of $2\times10^7$ A/cm$^2$ and at an ambient temperature of 80° C., and the resistance and the resistance change rate were not changed up to 1,000 hours.

A still further example of application of the magnetoresistive device according to the present invention to the magnetoresistive sensor shown in FIG. 2 will be described. In this example, the lower shield layer was formed by using FeTaN, and the lower gap layer was formed by using amorphous carbon. As the magnetoresistive device was used the structure shown in FIG. 6. As the under layer 101 was formed a Ta (5 nm thick)/Zr (2 nm thick) two-layer film, as the first free magnetic layer 102 a 6.0 nm thick $Ni_{81}Fe_{19}$ (at. %) film, as the second free magnetic layer 103 a 1.0 nm thick $Co_{90}Fe_{10}$ (at. %) film, as the non-magnetic layer 104 a 2.8 nm thick Cu film, as the MR enhancement layer 105 a 1.0 nm thick $Co_{90}Fe_{10}$ (at. %) film, as the fixed magnetic layer 106 a 2.6 nm thick $Ni_{81}Fe_{19}$ (at. %) film, as the anti-ferromagnetic layer 107 a 30 nm thick $Ni_{46}Mn_{54}$ (at. %) film, and as the protective layer 108 a 3.0 nm thick Ta film. The film structure thus formed was then heat treated for providing an exchange coupled field from the anti-ferromagnetic layer to the fixed magnetic layer. The structure was then patterned in a PR process to a size of 1×1 μm. Lower electrode layers of CoCrPt and Mo were then formed such that they were continuous to the edges of the patterned structure. The upper gap layer was formed by using aluminum, and the upper shield layer was formed by using NiFe. The head thus obtained was then processed and slider processed to obtain the recording/reproducing head as shown in FIG. 3, and used for recording and reproducing data on and from a CoCroa recording medium. The write track width was sent to 1.5 μm, the write gap to 0.2 μm, the read track width to 1.0 μm, and the read gap to 0.21 μm. The coercive force of the medium was 2.5 koe.

The reproduced output was measured by varying the recording mark length, and a frequency of 160 kFCI was obtained with a recording mark length corresponding to the reproduced output reduction to one half. The reproduced output was 1.7 mV peak-to-peak, and a waveform free from noise and having satisfactory symmetricity could be obtained. The signal-to-noise rate was 26.9 dB and the error rate was $10^{-6}$ or below. An environment test of the head was conducted under conditions of 80° C. and 500 Oe, and the error rate was not changed up to 2,500 hours. A current conduction test of the head was conducted with a current density of $2\times10^7$ A/cm$^2$ and at an ambient temperature of 80° C., and the resistance and the resistance change rate were not changed up to 1,000 hours.

A magnetic disk apparatus manufactured by applying the present invention will now be described. The magnetic disk apparatus has three magnetic disks provided on a base. A head drive circuit, a signal processor and an input/output interface are provided on the back side of the base. The apparatus is connected to an external unit via 32-bit bus line. Six heads are disposed on both surfaces of the magnetic disk. A rotary actuator for driving the heads, a drive and control circuit for the actuator and a motor directly coupled to a disk rotation spindle are mounted. The disc diameter is 46 mm, and the data surface diameter ranges from 10 to 40 mm. A buried servo system is used, and it is possible to increase the density because there is no servo surface. The apparatus can be directly connected as an external memory to a small-size computer. The input/output interface includes a cash memory, and can cope with a bus line with a transfer rate in a range of 5 to 20 megabytes per second. It is possible to construct a large capacity magnetic disk apparatus by providing an external controller and connecting a plurality of apparatus as this apparatus.

According to the present invention, with the provision of the ground layer constituted by two or more metal layers of different materials between the substrate and the magnetic layer or the anti-ferromagnetic layer, it is possible to obtain satisfactory output, output waveform and bit error rate when the present invention is applied to magnetoresistive devices, magnetoresistive sensors, magnetoresistive sensor systems and magnetic memory systems, and also obtain excellent thermal reliability.

Changes in construction will occur to those skilled in the art and various apparently different modifications and embodiments may be made without departing from the scope of the present invention. The matter set forth in the foregoing description and accompanying drawings is offered by way of illustration only. It is therefore intended that the foregoing description be regarded as illustrative rather than limiting.

What is claimed is:

1. A magnetoresistive device comprising a magnetic layer, a non-magnetic layer, a magnetic layer and an anti-ferromagnetic layer, these layers being formed in the mentioned order on an under layer formed on a substrate, or an anti-ferromagnetic layer, a magnetic layer, a non-magnetic layer and a magnetic layer, these layers being formed in the mentioned order on an under layer formed on a substrate,
   wherein the under layer is a laminate layer constituted by at least a lower metal layer and an upper metal layer of different materials wherein the upper metal layer of the laminate layer is amorphous.

2. The magnetoresistive device according to claim 1, wherein the metal layers are formed by using a member or an alloy of two or more members of the metal group consisting of Ta, Hf, Zr, W, Cr, Ti, Mo, Pt, Ni, Ir, Cu, Ag, Co, Zn, Ru, Rh, Re, Au, Os, Pd, Nb and V.

3. The magnetoresistive device according to claim 1, wherein the metal layers are formed by using a member of the group consisting of Ta, Hf, Zr, W, Cr, Ti, Mo, Pt, Ni, Ir, Cu, Ag, Co, Zn, Ru, Rh, Re, Au, Os, Pd, Nb and V.

4. A shield magnetoresistive sensor comprising lower shield layer, a lower gap layer, a magnetroresistance effect device, these layers and the device being laminatedly formed in the mentioned order on a substrate, the lower shield layer being patterned, the magnetoresistive device being patterned, a vertical bias layer, a lower electrode layer, these layers being laminatedly formed in the mentioned order such as to be continuous to the edges of the patterned magnetoresistive device, an upper gap layer, and an upper shield layer, these layers being laminatedly formed in the mentioned order on the lower electrode layer and the magnetoresistive device,
   wherein the magnetoresistive device is as set forth in one of claims 1 to 3.

5. A magnetoresistive device according to claim 1, comprising a patterned lower shield layer, a lower gap layer, a patterned magnetoresistive device, these layers and the device being laminatedly formed in the mentioned order on a substrate, a vertical bias layer, a lower electrode layer, these layers being laminatedly formed in the mentioned order such as to partly overlap the patterned magnetoresistive device, an upper gap layer, an upper shield layer, these layers being laminatedly formed in the mentioned order on the lower gap layer and the lower shield layer.

6. A magnetoresistive sensor system comprising the magneto-resistive sensor according to claim 4 and 5, comprises means for generating a current passing through the magnetoresistive sensor, means for detecting a resistance change rate as a function of a magnetic field detected by the magnetoresistive sensor.

7. A magnetic memory system comprising a magnetic memory medium having a plurality of data recording tracks, a magnetic recording system for storing data on the magnetic memory medium, the magnetoresistive sensor system according to claim 6, and actuator means coupled to the magnetoresistive sensor system and also to the magnetic recording system and capable of shifting the magnetoresistive sensor system and the magnetic recording system to a position corresponding to a selected track on the magnetic recording medium.

8. The magnetoresistive device according to claim 4, wherein the lower shield layer is formed by using a material selected from the group consisting of NiFe, CoZr, CoFeB, CoZrMo, CoZrNb, CoZr, CoZrTa, CoHf, CoTa, CoTaHf, CoNbHf, CoZrNb, CoHfPd, CoTaZrNb, CoZrMoNi, FeAlSi, and iron nitride materials and its thickness ranges from 0.3 to 10 $\mu$m, the lower gap layer is formed by using a material selected from the group consisting of aluminum, $SiO_2$, aluminum nitride, silicon nitride, and diamond-like carbon and its thickness is in a range of 0.01 to 0.20 $\mu$m, the lower electrode layer is formed by using Zr, Ta and Mo either alone or in the form of alloys or mixtures and its thickness ranges from 0.01 to 0.10 $\mu$m, the vertical bias layer is formed by using a material selected from the group consisting of CoCrPt, CoCr, CoPt, CoCrTa, FeMn, NiMn, IrMn, PtPdMn, ReMn, PtMn, CrMn, Ni oxide, Fe oxide, mixtures of Ni oxide and Co oxide, mixtures of Ni oxide and Fe oxide, an Ni oxide/Co oxide two-layer film, and an Ni oxide/Fe oxide two-layer film, the gap regulation insulating layer is formed by using a material selected from the group consisting of aluminum, $SiO_2$, aluminum nitride, silicon nitride, and diamond-like carbon and its thickness ranges from 0.005 to 0.05 $\mu$m, the upper gap layer is formed by using a material selected from the group consisting of aluminum, $SiO_2$, aluminum nitride, silicon nitride, and diamond-like carbon and its thickness is in a range of 0.01 to 0.20 $\mu$m, or the upper shield layer is formed by using a material selected from the group consisting of NiFe, CoZr, CoFeB, CoZrMo, CoZrNb, CoZr, CoZrTa, CoHf, CoTa, CoTaHf, CoNbHf, CoZrNb, CoHfPd, CoTaZrNb, CoZrMoNi, FeAlSi, and iron nitride materials and its thickness ranges from 0.3 to 10 $\mu$m.

9. The magnetoresistive device according to claim 5, wherein the lower shield layer is formed by using NiFe, CoZr, CoFeB, CoZrMo, CoZrNb, CoZr, CoZrTa, CoHf, CoTa, CoTaHf, CoNbHf, CoZrNb, CoHfPd, COTaZrNb, CoZrMoNi, FeAlSi, iron nitride type materials and its thickness ranges from 0.3 to 10 $\mu$m, the lower gap layer is formed by using aluminum, $SiO_2$, aluminum nitride, silicon nitride, diamond-like carbon and its thickness is in a range of 0.01 to 0.20 $\mu$m, the lower electrode layer is formed by using Zr, Ta and Mo either alone or in the form of alloys or mixtures and its thickness ranges from 0.01 to 0.10 $\mu$m, the vertical bias layer is formed by using CoCrPt, CoCr, CoPt, CoCrTa, FeMn, NiMn, IrMn, PtPdMn, ReMn, PtMn, CrMn, Ni oxide, Fe oxide, mixtures of Ni oxide and Co oxide, mixtures of Ni oxide and Fe oxide, an Ni oxide/Co oxide two-layer film, an Ni oxide/Fe oxide two-layer film, the upper gap layer is formed by using aluminum, $SiO_2$, aluminum nitride, silicon nitride, diamond-like carbon and its thickness is in a range of 0.01 to 0.20 $\mu$m, or the upper shield layer is formed by using NiFe, CoZr, CoFeB, CoZrMo, CoZrNb, CoZr, CoZrTa, CoHf, CoTa, CoTaHf, CoNbHf, CoZrNb, CoHfPd, CoTaZrNb, CoZrMoNi, FeAlSi, iron nitride type materials and its thickness ranges from 0.3 to 10 μm.

10. A magnetoresistive device formed by laminating an under layer, a first free magnetic layer, a non-magnetic layer, an MR enhancement layer, a fixed magnetic layer, an anti-ferromagnetic layer and a protective layer in this order on a substrate, wherein the under layer is a laminate layer constituted by at least a lower metal layer and an upper metal layer of different materials wherein the upper metal layer of the laminate layer is amorphous.

11. A magnetoresistive device formed by laminating an under layer, a first free magnetic layer, a second free magnetic layer, a non-magnetic layer, an MR enhancement layer, a fixed magnetic layer, an anti-ferromagnetic layer and a protective layer in this order on a substrate, wherein the under layer is a laminate layer constituted by at least a lower metal layer and an upper metal layers or different materials wherein the upper metal layer of the laminate layer is amorphous.

12. A magnetoresistive device formed by laminating an under layer, a first free magnetic layer, a non-magnetic layer, a fixed magnetic layer, an anti-ferromagnetic layer and a protective layer in this order on a substrate, wherein the under layer is a laminate layer constituted by at least a lower metal layer and an upper metal layer of different materials wherein the upper metal layer of the laminate layer is amorphous.

13. A magnetoresistive device formed by laminating an under layer, a first free magnetic layer, a second free magnetic layer, a non-magnetic layer, a fixed magnetic layer, an anti-ferromagnetic layer and a protective layer in this order on a substrate, wherein the under layer is a laminate layer constituted by at least a lower metal layer and an upper metal layer of different materials wherein the upper metal layer of the laminate layer is amorphous.

14. A magnetoresistive sensor system comprising the magnetoresistive sensor according to claim 5, comprises means for generating a current passing through the magnetoresistive sensor, means for detecting a resistance change rate as a function of a magnetic field detected by the magnetoresistive sensor.

* * * * *

UNITED STATES PATENT AND TRADEMARK OFFICE
CERTIFICATE OF CORRECTION

PATENT NO. : 6,090,480
DATED : July 18, 2000
INVENTOR(S) : Hayashi, Kazuhiko

It is certified that error appears in the above-identified patent and that said Letters Patent is hereby corrected as shown below:

Column 8,
Line 12, delete "rm" insert -- nm --;
Line 31, delete "rm" insert -- nm --

Column 11,
Line 56, delete "$Co_{99}$" insert -- $Co_{90}$ --

Column 14,
Line 45, delete "signalto" insert -- signal --

Column 15,
Line 60, delete "Koe" insert -- KOe --

Column 16,
Line 35, delete "CoCroa" insert -- CoCrTa --;
Line 38 delete "Koe" insert -- KOe --

Column 18,
Line 52, delete "$CO_1$" insert -- Co --;
Line 50, after "using" insert -- a material selected form the group consisting of --;
Line 53, after "FeAlS" insert -- and --; delete "type";
Line 55, after "using" insert -- a material selected form the group consisting of --;
Line 56, after "nitride," insert -- and --;
Line 60, after "using" insert -- a material selected form the group consisting of --;
Line 64, after "film" insert -- and --;
Line 65, after "using" insert -- a material selected form a group consisting of --;
Line 66, after "nitride," insert -- and --

UNITED STATES PATENT AND TRADEMARK OFFICE
CERTIFICATE OF CORRECTION

PATENT NO. : 6,090,480
DATED : July 18, 2000
INVENTOR(S) : Hayashi, Kazuhiko

It is certified that error appears in the above-identified patent and that said Letters Patent is hereby corrected as shown below:

Column 19,
Line 1, after "using" insert -- a material selected form the group consisting of --;
Lines 3 & 4, delete "iron nitride type" insert -- and iron nitride --

Signed and Sealed this

Twenty-third Day of October, 2001

Attest:

*Nicholas P. Godici*

NICHOLAS P. GODICI
*Attesting Officer*    *Acting Director of the United States Patent and Trademark Office*